(12) United States Patent
Fujioka et al.

(10) Patent No.: US 10,903,359 B2
(45) Date of Patent: Jan. 26, 2021

(54) SEMICONDUCTOR DEVICE

(71) Applicant: PANASONIC INTELLECTUAL PROPERTY MANAGEMENT CO., LTD., Osaka (JP)

(72) Inventors: Chie Fujioka, Kyoto (JP); Hiroshi Yoshida, Niigata (JP); Yoshihiro Matsushima, Shiga (JP); Hideki Mizuhara, Kyoto (JP); Masao Hamasaki, Osaka (JP); Mitsuaki Sakamoto, Kyoto (JP)

(73) Assignee: PANASONIC SEMICONDUCTOR SOLUTIONS CO., LTD., Kyoto (JP)

( * ) Notice: Subject to any disclaimer, the term of this patent is extended or adjusted under 35 U.S.C. 154(b) by 15 days.

(21) Appl. No.: 16/488,199

(22) PCT Filed: Jan. 17, 2019

(86) PCT No.: PCT/JP2019/001315
§ 371 (c)(1),
(2) Date: Aug. 22, 2019

(87) PCT Pub. No.: WO2019/244383
PCT Pub. Date: Dec. 26, 2019

(65) Prior Publication Data
US 2020/0395479 A1   Dec. 17, 2020

Related U.S. Application Data

(60) Provisional application No. 62/687,051, filed on Jun. 19, 2018.

(51) Int. Cl.
*H01L 29/78* (2006.01)
*H01L 23/538* (2006.01)
*H01L 27/088* (2006.01)

(52) U.S. Cl.
CPC ...... *H01L 29/7827* (2013.01); *H01L 23/5386* (2013.01); *H01L 27/088* (2013.01)

(58) Field of Classification Search
CPC ............ H01L 29/7827; H01L 23/5386; H01L 27/088
See application file for complete search history.

(56) References Cited

U.S. PATENT DOCUMENTS

2013/0320454 A1   12/2013   Suzuki et al.
2015/0357424 A1   12/2015   Kitao
(Continued)

FOREIGN PATENT DOCUMENTS

JP   2011-219828 A   11/2011
JP   2012-182238 A   9/2012
(Continued)

OTHER PUBLICATIONS

Tohru Watanabe, "Structure Control Theory of Plated Film—Part of Epitaxy—"J. Japan Inst. Metals, vol. 66, No. 4, (2002), pp. 362-370 Overview with English Abstract.
(Continued)

*Primary Examiner* — Mark V Prenty
(74) *Attorney, Agent, or Firm* — McDermott Will and Emery LLP

(57) ABSTRACT

A semiconductor device includes: a semiconductor layer that includes principal surfaces; a metal layer that includes principal surfaces, is disposed with the principal surface in contact with the principal surface, is thicker than the semiconductor layer, and comprises a first metal material; a metal layer that includes principal surfaces, is disposed with the principal surface in contact with the principal surface, and comprises a metal material having a Young's modulus greater than that of the first metal material; and transistors. The transistor includes a source electrode and a gate electrode on a side facing the principal surface. The transistor
(Continued)

includes a source electrode and a gate electrode on a side facing the principal surface.

38 Claims, 18 Drawing Sheets

(56) References Cited

U.S. PATENT DOCUMENTS

| | | |
|---|---|---|
| 2017/0358510 A1 | 12/2017 | Park et al. |
| 2018/0090611 A1 | 3/2018 | Togami |
| 2018/0122939 A1 | 5/2018 | Ota et al. |
| 2019/0157403 A1 | 5/2019 | Yasuda et al. |
| 2019/0319126 A1* | 10/2019 | Matsushima ........... H01L 24/83 |

FOREIGN PATENT DOCUMENTS

| | | |
|---|---|---|
| JP | 2013-247309 A | 12/2013 |
| JP | 2015-231033 A | 12/2015 |
| JP | 2016-086006 A | 5/2016 |
| JP | 2018-049974 A | 3/2018 |
| WO | 2017/002368 A1 | 1/2017 |
| WO | 2018/025839 A1 | 2/2018 |
| WO | 2018/123799 A1 | 7/2018 |

OTHER PUBLICATIONS

Tohru Watanabe, Doctor of Engineering, "Fine Platin, Mekkimaku no Kozoseigyo gijyutsu to Kaisekiho (Techniques of Structural Control of Plated Film and Analytical Methods Therefor)", Technical Information Institute Co., LTD., Feb. 28, 2002 with partial English translation.

Hakaru Masumoto et al., "Crystal Anisotropy and Temperature Dependence of Young's Modulus of Nickel Single Crystals" J. Japan Inst. Metals, vol. 32, No. 6, Jun. 1968, pp. 525-528 with English Abstract.

International Search Report and Written Opinion dated Apr. 9, 2019 in International Application No. PCT/JP2019/001315, with partial English translation.

* cited by examiner (a) PRINCIPAL SURFACE 30b (b)

(a)

(b)

SEMICONDUCTOR DEVICE

CROSS-REFERENCE OF RELATED APPLICATIONS

This application is the U.S. National Phase under 35 U.S.C. § 371 of International Patent Application No. PCT/JP2019/001315, filed on Jan. 17, 2019, which in turn claims the benefit of U.S. Provisional Application No. 62/687,051, filed on Jun. 19, 2018, the entire disclosures of which Applications are incorporated by reference herein.

TECHNICAL FIELD

The present disclosure relates to semiconductor devices, and in particular to chip-size-package-type semiconductor devices that are facedown mountable.

BACKGROUND ART

Conventionally, a semiconductor device has been proposed that includes: a semiconductor layer having a first principal surface and a second principal surface; two vertical field-effect transistors provided extending from the first principal surface to the second principal surface, and a metal layer formed on the second principal surface. This configuration allows not only a horizontal path in the semiconductor substrate, but a horizontal path in the metal layer, where conduction resistance is low, to be used as a path along which current flows from the first transistor to the second transistor, whereby the on-resistance of the semiconductor device can be lowered.

Patent Literature (PTL) 1 proposes a flip-chip semiconductor device which has, in addition to the above configuration, a conductive layer formed on a side of the metal layer that is the side opposite to the semiconductor substrate. The conductive layer can inhibit burrs of the metal layer from forming in the chip singulation step.

PTL 2 proposes a flip-chip semiconductor device which has, in addition to the above configuration, an insulating coating formed on a side of the metal layer that is the side opposite to the semiconductor substrate. The insulating coating can prevent scratches, breaks, and other damages while keeping the semiconductor device thin.

CITATION LIST

Patent Literature

PTL 1: Japanese Unexamined Patent Application Publication No. 2016-86006
PTL 2: Japanese Unexamined Patent Application Publication No. 2012-182238

SUMMARY OF THE INVENTION

Technical Problems

However, in the semiconductor devices disclosed in PTL 1 and PTL 2, the coefficient of thermal expansion of the metal layer is greater than the coefficient of thermal expansion of the semiconductor substrate, which causes the semiconductor device to warp from changes in temperature.

In PTL 1, the conductive layer is formed on a side of the metal layer that is the side opposite to the semiconductor substrate, but since the conductive layer primarily contains the same metal contained in the metal layer, from a manufacturing viewpoint, it is not easy to form a conductive layer thick enough to reduce the warpage of the semiconductor device from changes in temperature.

In PTL 2, an insulating coating for reducing the thickness of the semiconductor device and preventing damage of the semiconductor device is formed on a side of the metal layer that is the side opposite to the semiconductor substrate, but no stress great enough to reduce the warpage of the semiconductor device is induced in the insulating coating when the metal layer is formed at a thickness required to ensure low on-resistance.

That is, the semiconductor devices disclosed in PTL 1 and PTL 2 cannot lower the on-resistance and suppress warpage of the semiconductor device at the same time.

In view of this, the present disclosure has an object to provide a chip-size-package-type semiconductor device that allows both reduction in on-resistance and suppression of warpage.

Solutions to Problems

In order to solve the above problems, a semiconductor device according to one aspect of the present disclosure is a chip-size-package-type semiconductor device that is facedown mountable, the semiconductor device including: a semiconductor layer that includes a first principal surface and a second principal surface that face in opposite directions, and comprises silicon, gallium nitride, or silicon carbide; a first metal layer that includes a third principal surface and a fourth principal surface that face in opposite directions, is disposed with the third principal surface in contact with the second principal surface, is thicker than the semiconductor layer, and comprises a first metal material; a second metal layer that includes a fifth principal surface and a sixth principal surface that face in opposite directions, is thicker than the semiconductor layer, and comprises a second metal material having a Young's modulus greater than a Young's modulus of the first metal material; a first vertical field effect transistor disposed in a first region of the semiconductor layer; and a second vertical field effect transistor disposed in a second region adjacent to the first region in a direction along the first principal surface in the semiconductor layer. The first vertical field effect transistor includes a first source electrode and a first gate electrode on a side facing the first principal surface of the semiconductor layer. The second vertical field effect transistor includes a second source electrode and a second gate electrode on the side facing the first principal surface of the semiconductor layer. The first metal layer functions as a common drain electrode for the first vertical field effect transistor and the second vertical field effect transistor. A bidirectional path from the first source electrode to the second source electrode via the common drain electrode is a primary current path.

The configuration described above, in which the first metal layer having a thickness for ensuring low on-resistance is in contact with the second metal layer having a Young's modulus greater than that of the first metal layer and thicker than the semiconductor layer, can suppress warpage of the semiconductor device that occurs due to the contact between the semiconductor layer and the first metal layer. A chip-size-package-type semiconductor device that allows both reduction in on-resistance and suppression of warpage can therefore be provided.

Advantageous Effects of Invention

With the semiconductor device according to the present disclosure, it is possible to provide a chip-size-package-type semiconductor device that can both reduce on-resistance and suppress warpage of the semiconductor device.

Figure 6:
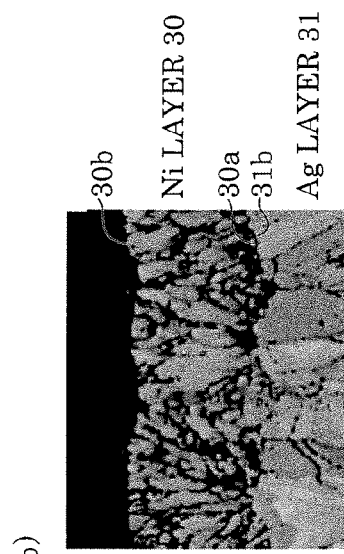
Figure 6:
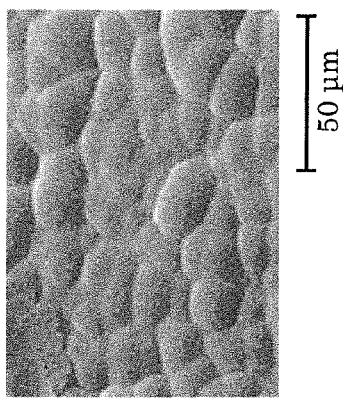
Figure 6:
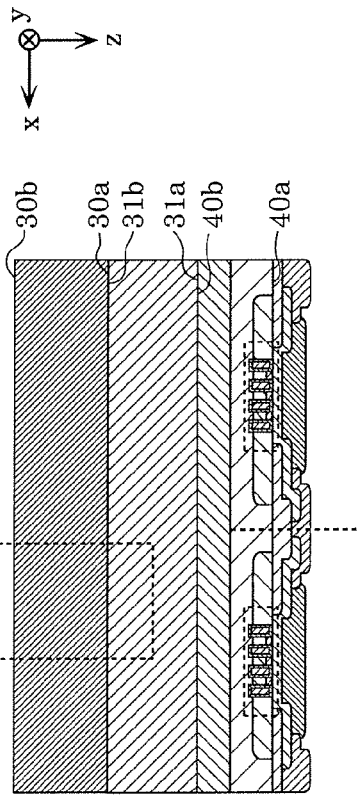

(a) in FIG. 6 is an electron micrograph of a principal surface of the Ni layer in the semiconductor device according to an embodiment, and (b) in FIG. 6 is an electron micrograph of a cross section of the Ni layer in the semiconductor device according to the embodiment.

Figure 7:
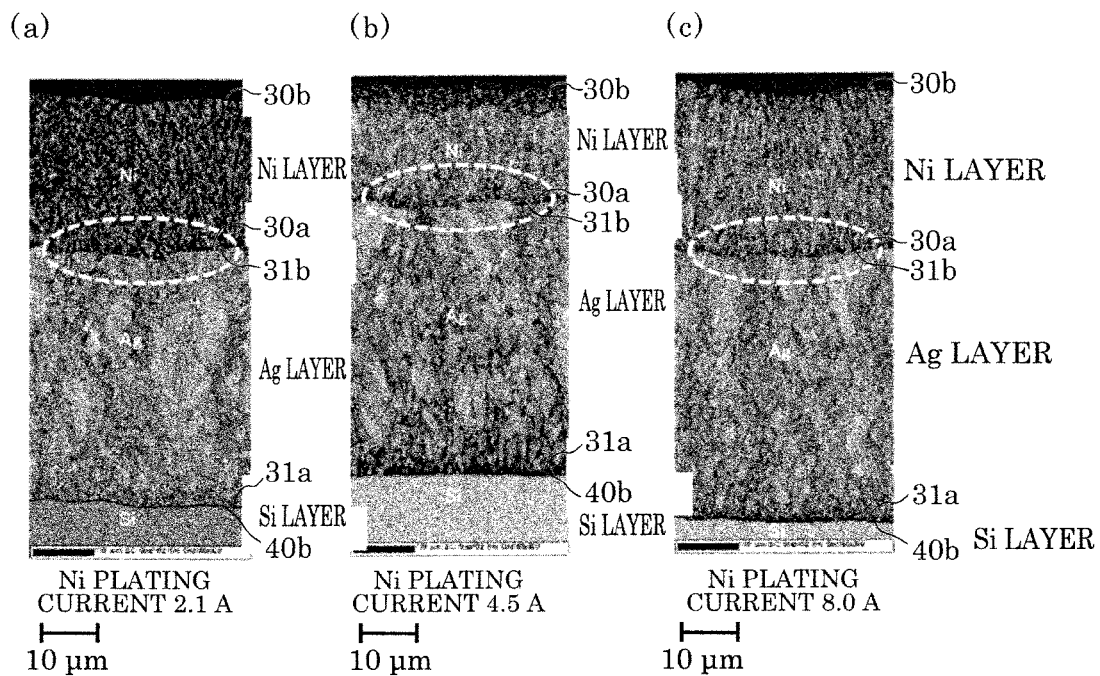

FIG. 7 shows electron micrographs each illustrating a cross section of the Ni layer/Ag layer in the semiconductor device according to an embodiment.

Figure 8:
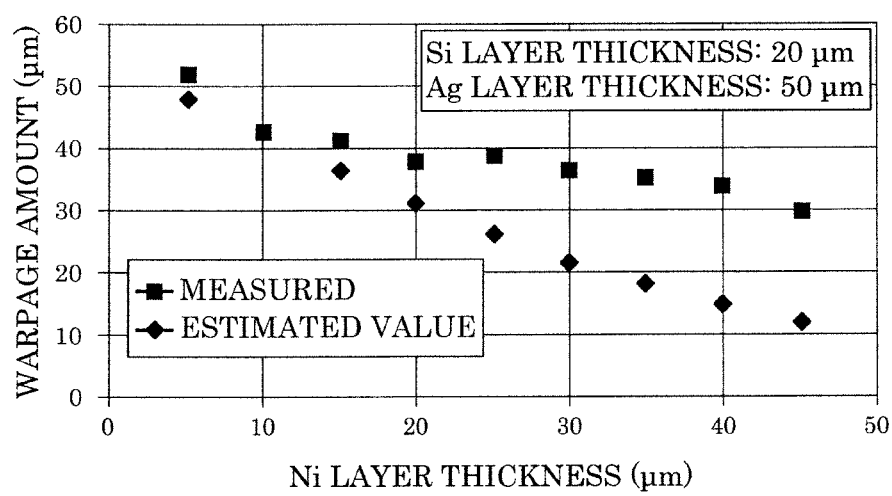

FIG. 8 shows a graph illustrating comparison between actually measured values and estimated values of the amount of warpage of the semiconductor device having the layered configuration formed of the Si layer/Ag layer/Ni layer versus the thickness of the Ni layer.

Figure 9:
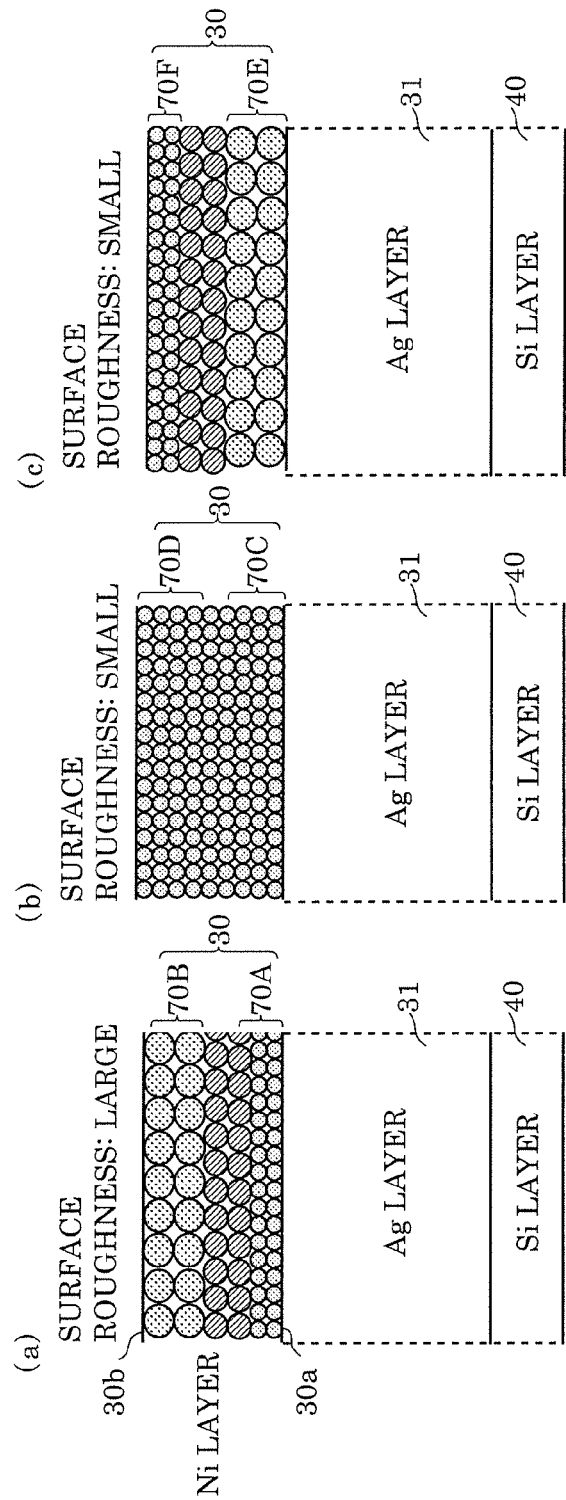

FIG. 9 is a schematic cross-sectional view of semiconductor devices each including an Ni layer formed of a plurality of layers containing different crystal grain sizes.

Figure 10:
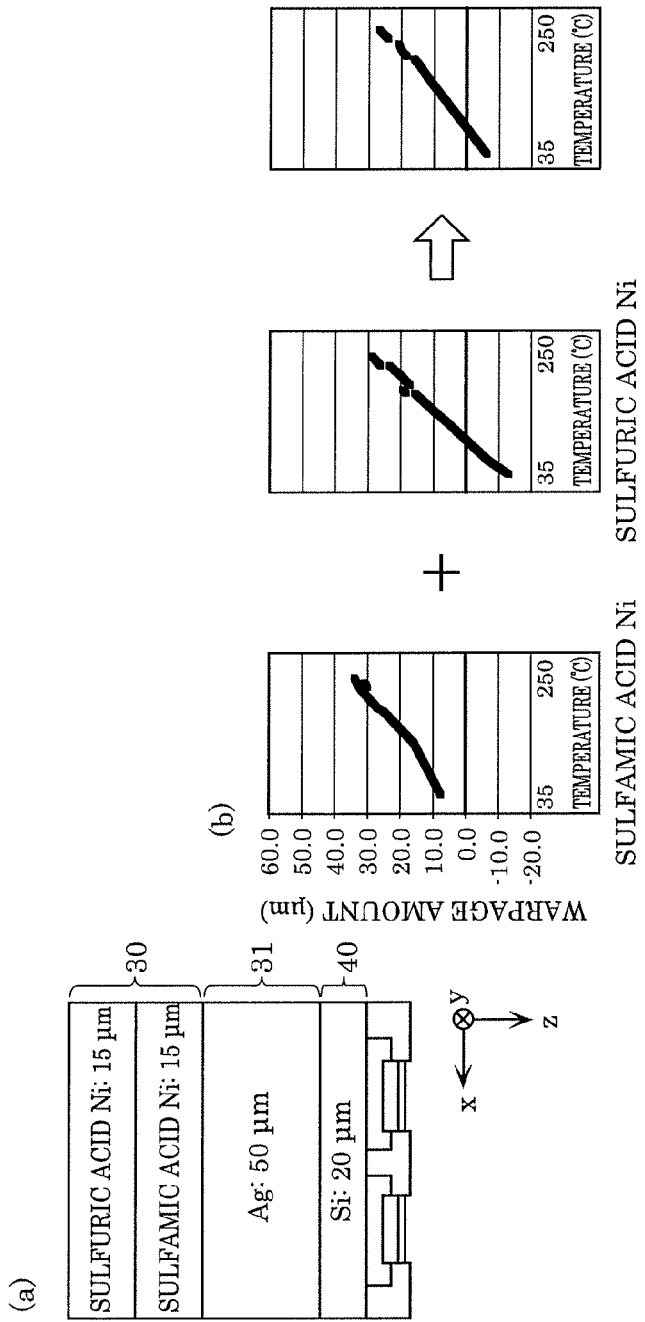

FIG. 10 shows the temperature dependence of the amount of warpage of a semiconductor device including an Ni layer formed of two layers formed by using different plating methods.

Figure 11:
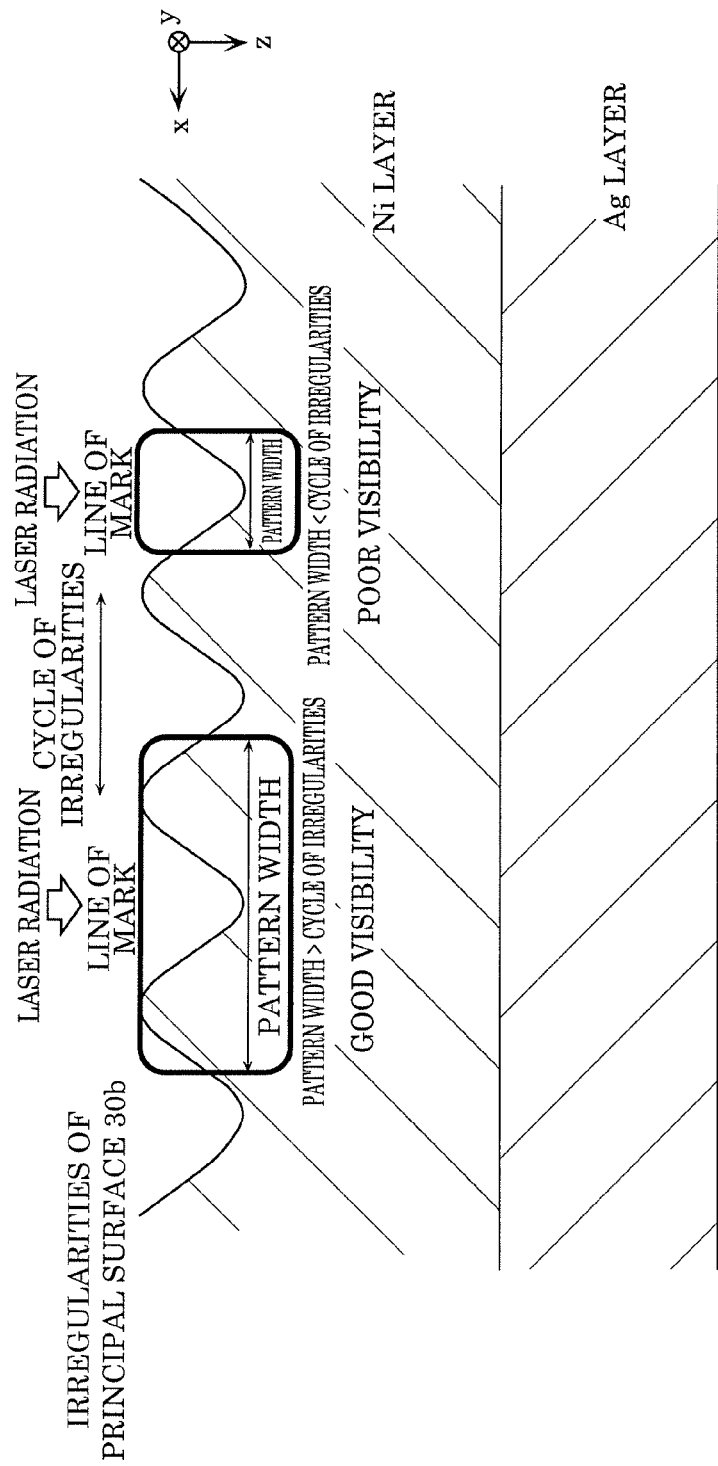

FIG. 11 is a schematic cross-sectional view showing the relationship of the cycle of irregularities of a principal surface of the Ni layer and the width of a mark pattern with the visibility of the mark.

Figure 12:
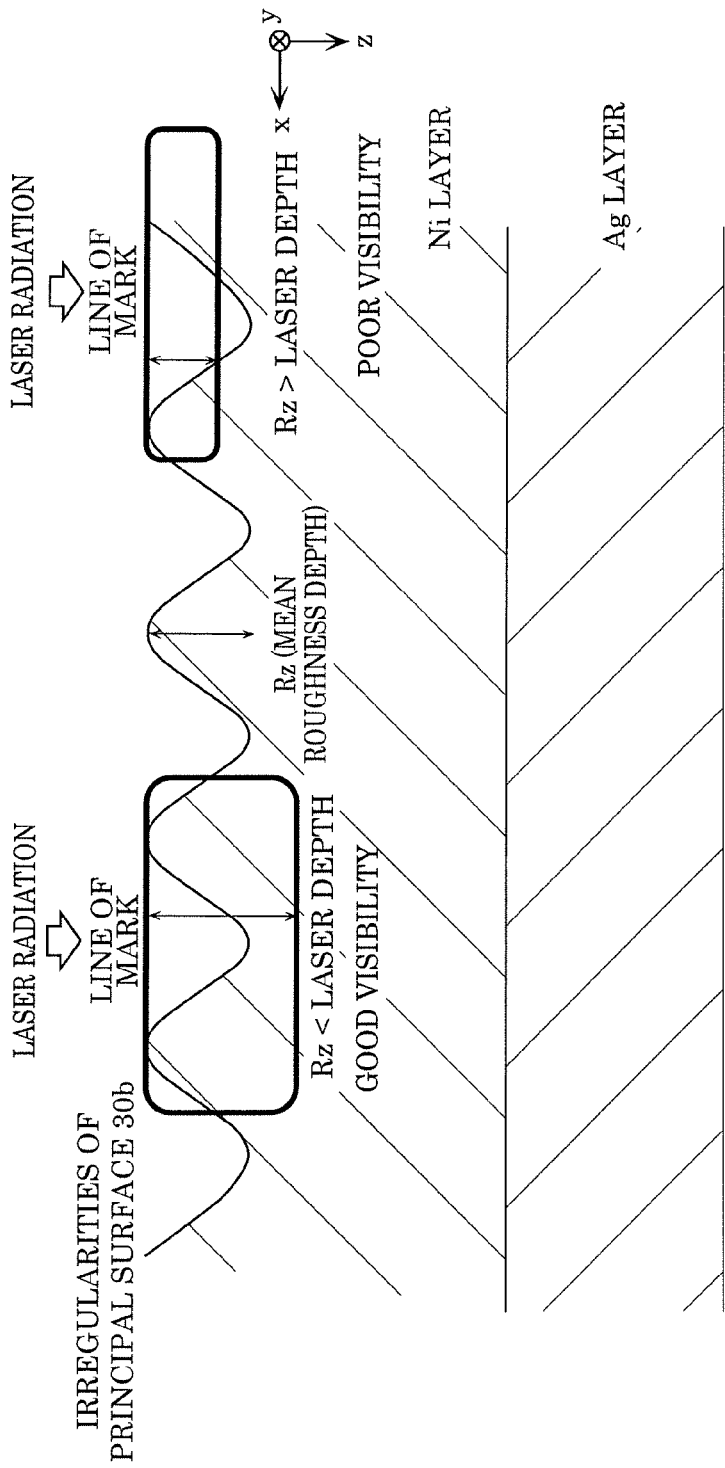

FIG. 12 is a schematic cross-sectional view showing the relationship of the mean roughness depth of the principal surface of the Ni layer and the depth of the mark with the visibility of the mark.

Figure 13A:
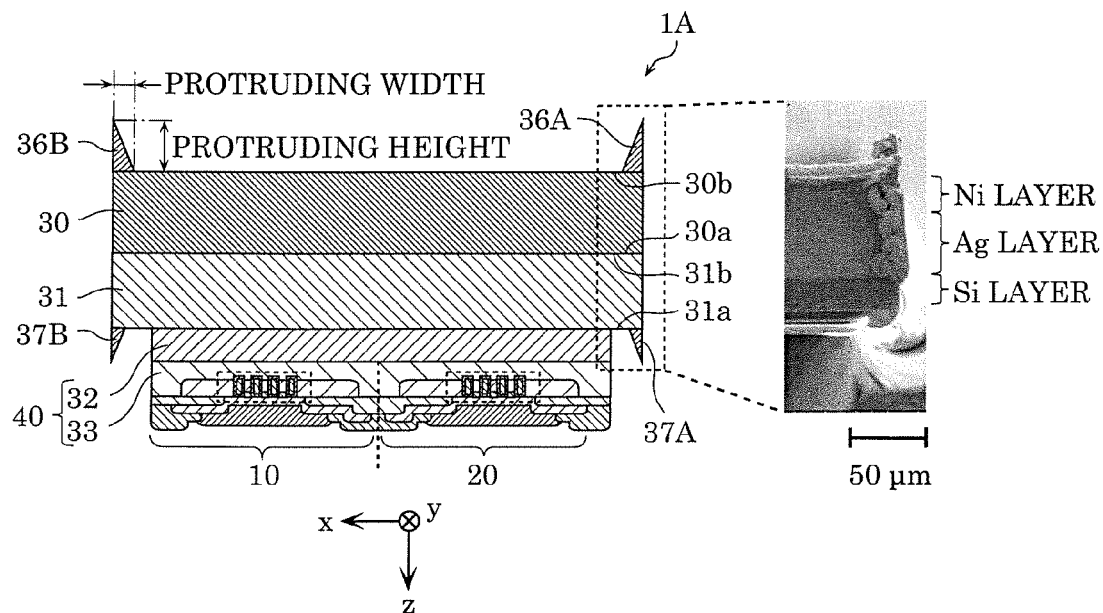

FIG. 13A is a cross-sectional view of a semiconductor device according to an embodiment.

Figure 13B:
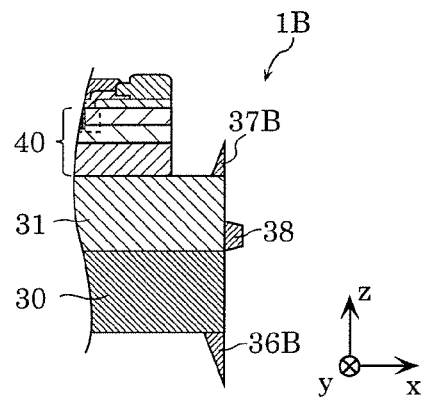

FIG. 13B is a cross-sectional view of a semiconductor device according to an embodiment.

Figure 13C:
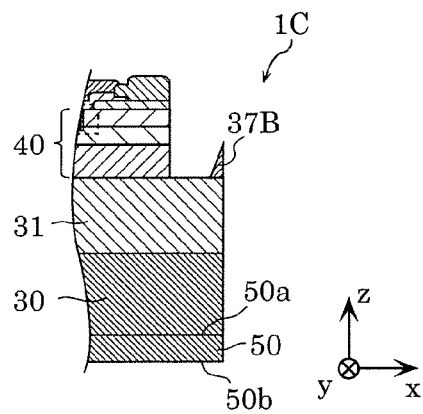

FIG. 13C is a cross-sectional view of a semiconductor device according to an embodiment.

Figure 13D:
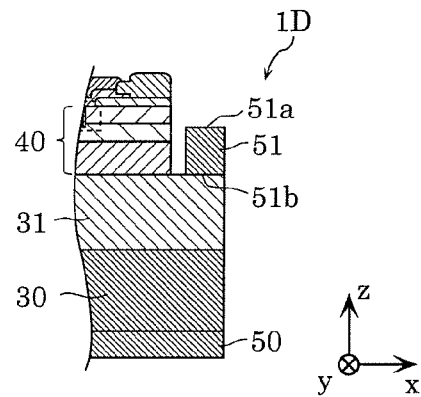

FIG. 13D is a cross-sectional view of a semiconductor device according to an embodiment.

Figure 13E:
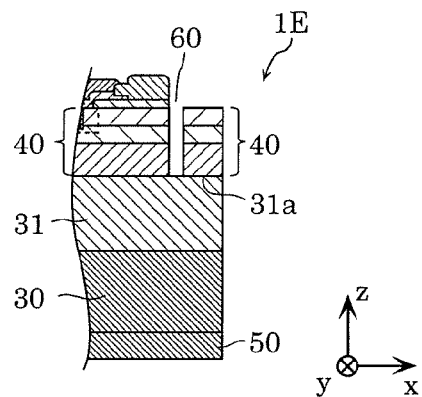

FIG. 13E is a cross-sectional view of a semiconductor device according to an embodiment.

Figure 13F:
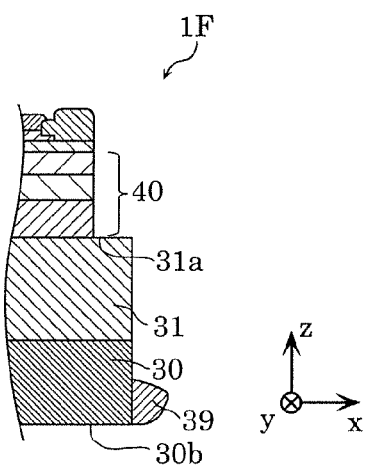

FIG. 13F is a cross-sectional view of a semiconductor device according to an embodiment.

Figure 14:
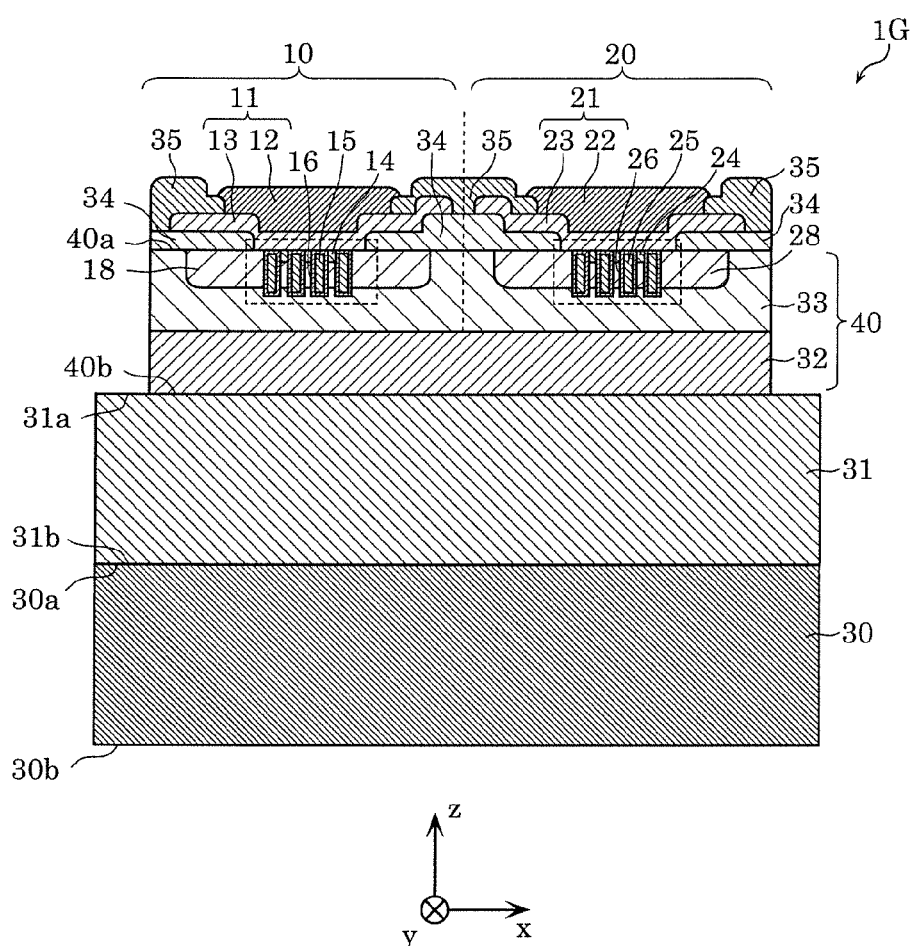

FIG. 14 is a cross-sectional view of a semiconductor device according to an embodiment.

Figure 15:
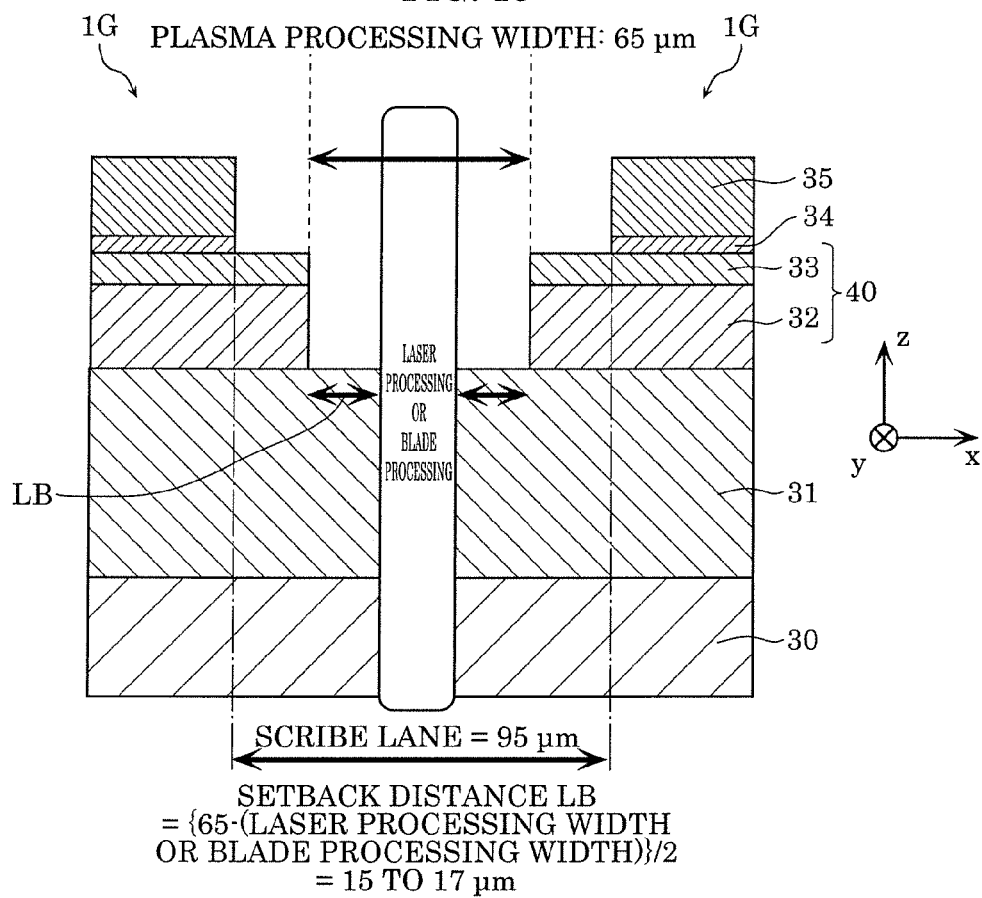

FIG. 15 describes a setback distance of the Si layer in a semiconductor device according to an embodiment.

Figure 16:
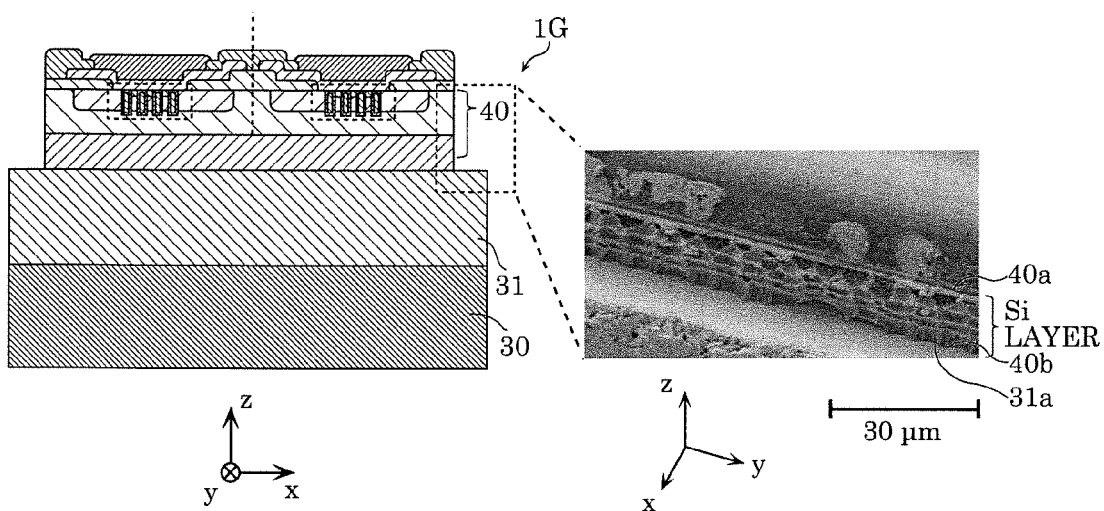

FIG. 16 is an electron micrograph of the side surface of the Si layer in a semiconductor device according to an embodiment.

Figure 17:
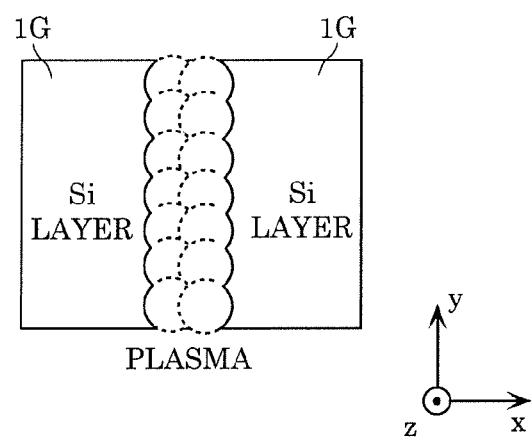
Figure 17:
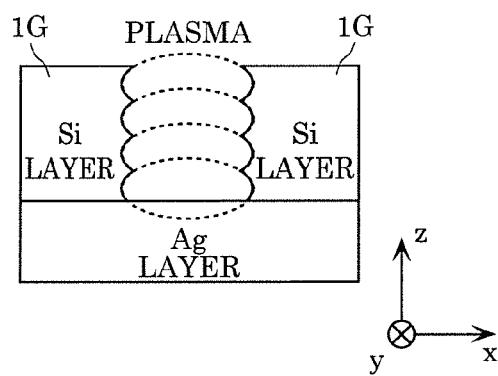

FIG. 17 describes the relationship between the shape of the side surface of the Si layer and the method for manufacturing the Si layer in a semiconductor device according to an embodiment.

Figure 18:
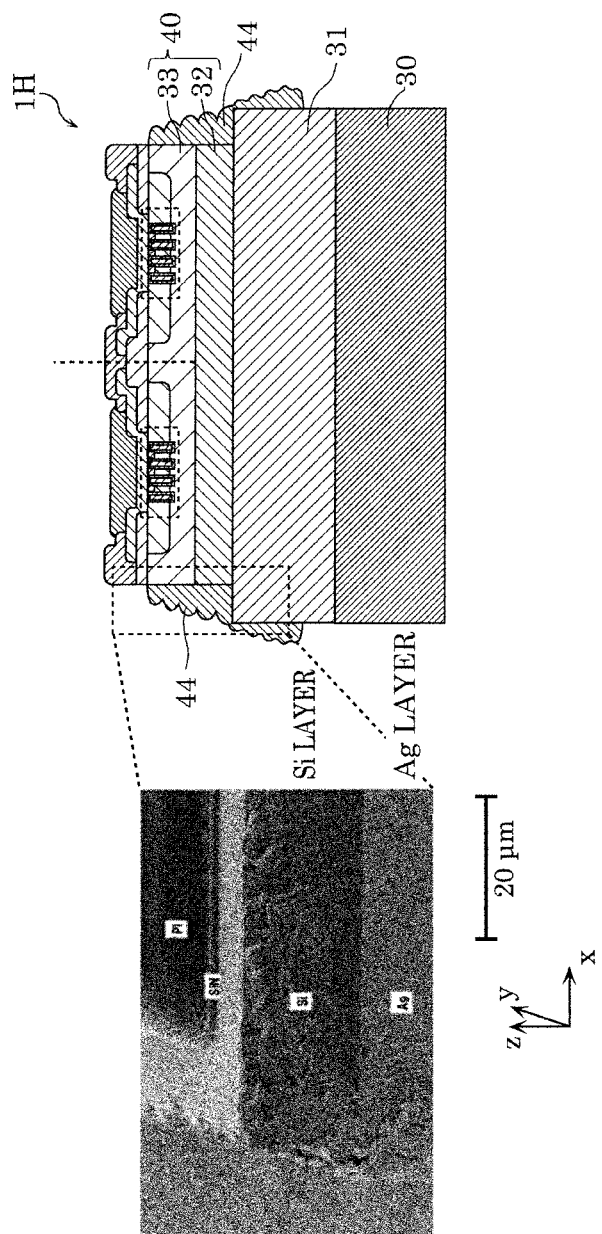

FIG. 18 is an electron micrograph of the side surface of the Si layer/Ag layer in a semiconductor device according to an embodiment.

Figure 19:
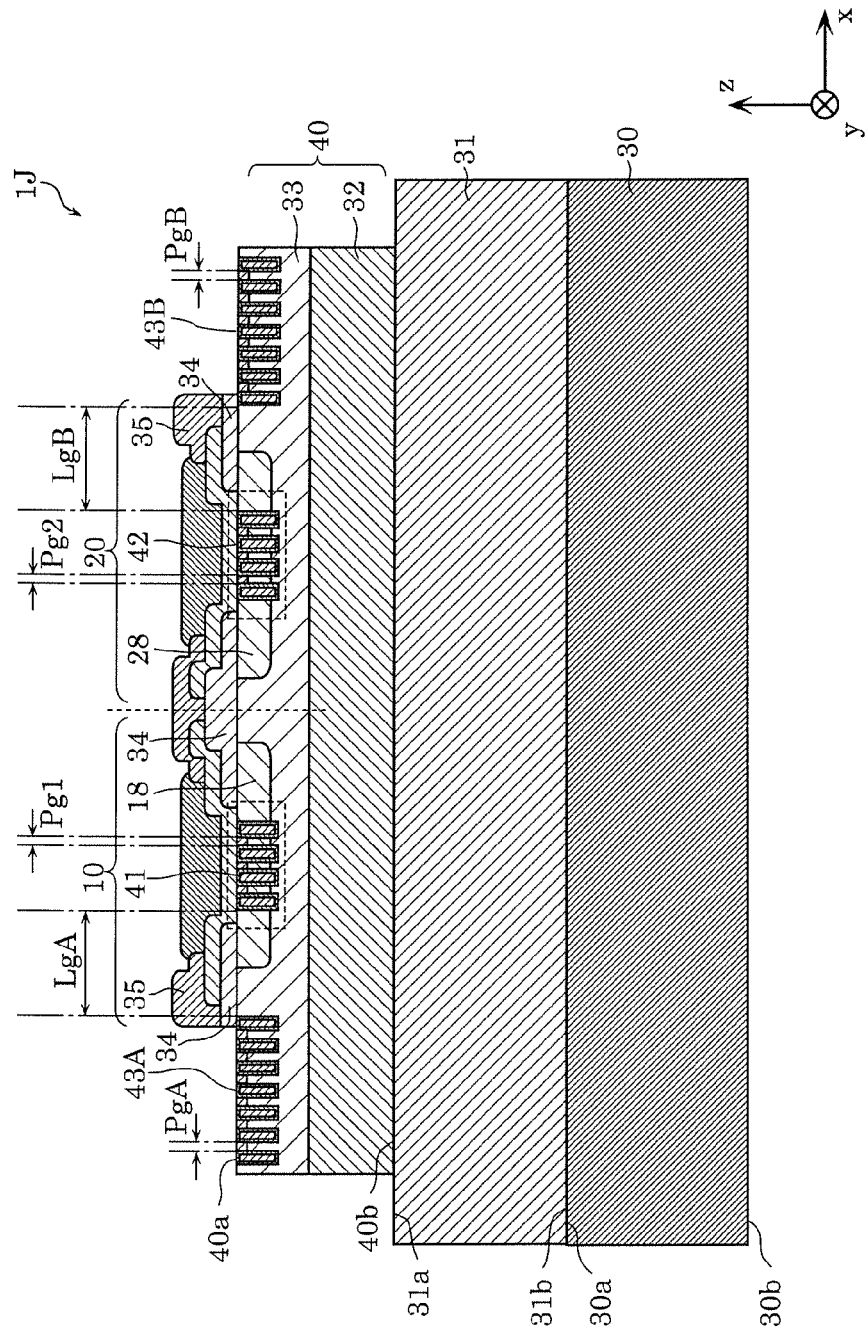

FIG. 19 is a cross-sectional view of a semiconductor device according to an embodiment.

Figure 20:
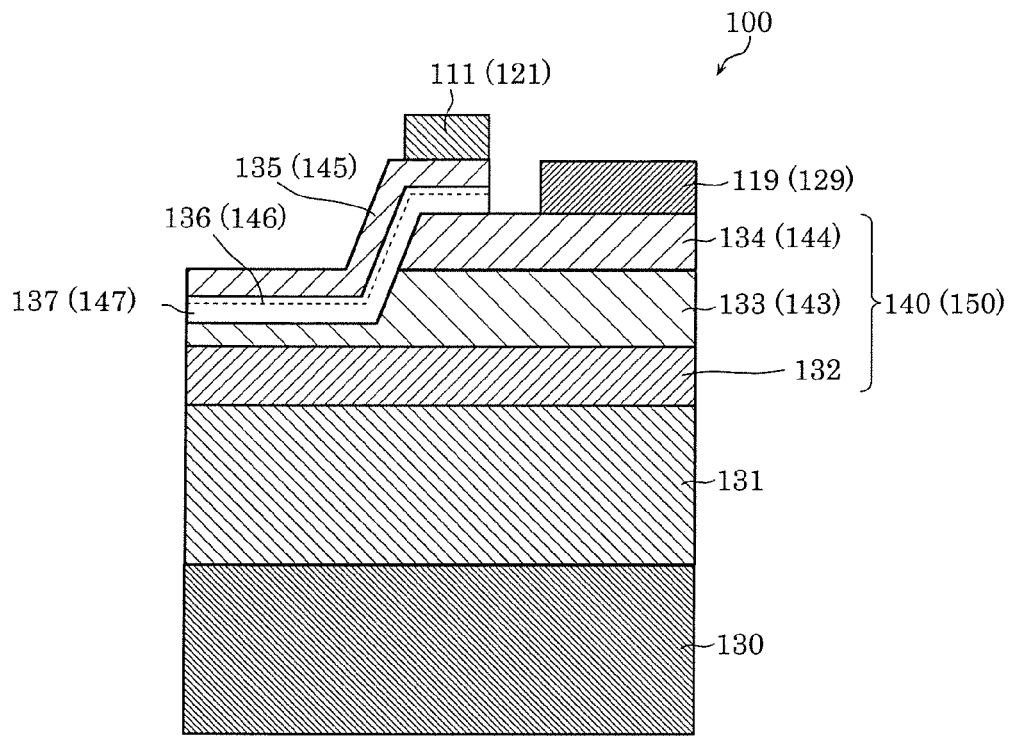

FIG. 20 is a schematic cross-sectional view of a semiconductor device according to an embodiment.

Figure 21:
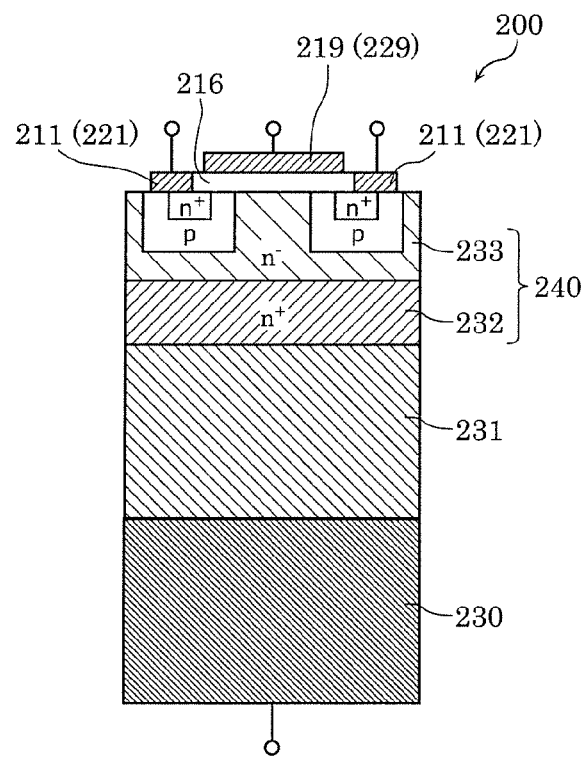

FIG. 21 is a schematic cross-sectional view of a semiconductor device according to an embodiment.

DESCRIPTION OF EXEMPLARY EMBODIMENTS

The following embodiment is a specific example of the present disclosure. The numerical values, shapes, materials, elements, arrangement and connection configuration of the elements, etc., described in the following embodiment are merely examples, and are not intended to limit the present disclosure. Among elements in the following embodiment, those not described in any one of the independent claims indicating the broadest concept of the present disclosure are described as optional elements.

Embodiment

[1. Configuration of Semiconductor Device]

Hereinafter, the configuration of semiconductor device 1 according to the present embodiment will be described. Semiconductor device 1 according to the present disclosure is a facedown mountable, chip-size-package (CSP) type multi-transistor chip including two vertical metal oxide semiconductor (MOS) transistors formed on a semiconductor substrate. The two vertical MOS transistors are each a power transistor and what is called a trench MOS field effect transistor (FET). Semiconductor device 1 according to the present embodiment is, however, not used in a device that belongs to optoelectronics products, such as a solid-state imaging device.

Figure 1:
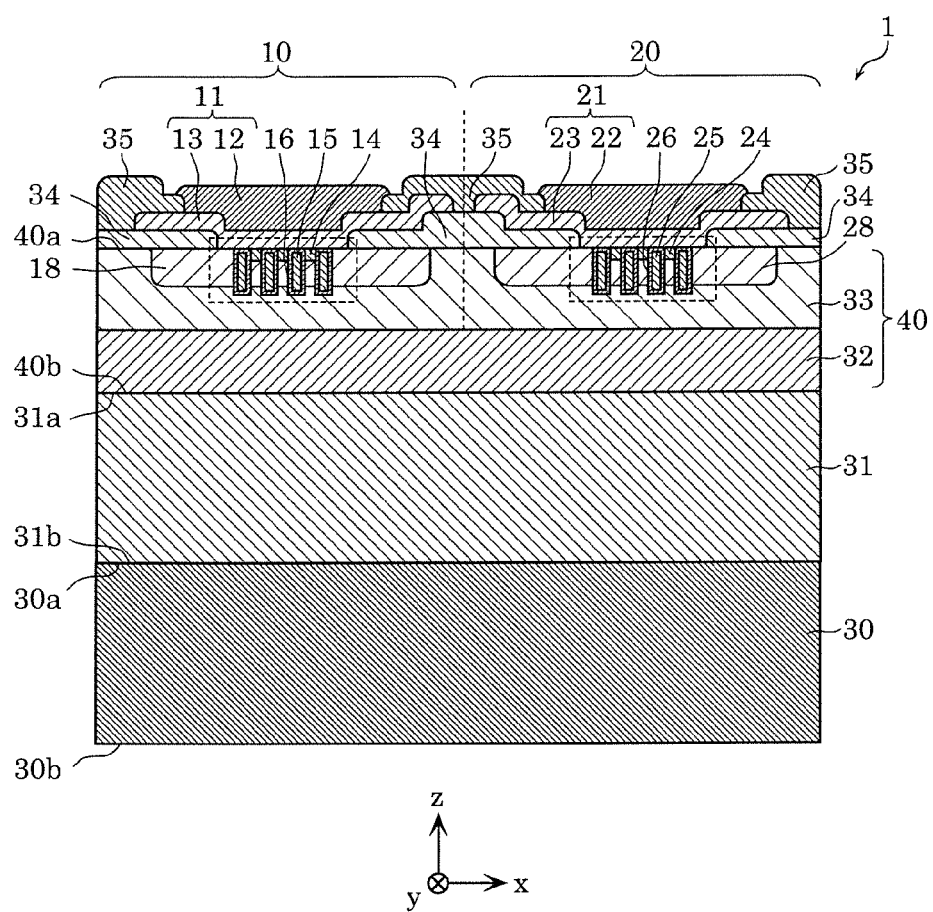
FIG. 1 is a cross-sectional view showing an example of the configuration of a semiconductor device according to an embodiment.
Figure 2:
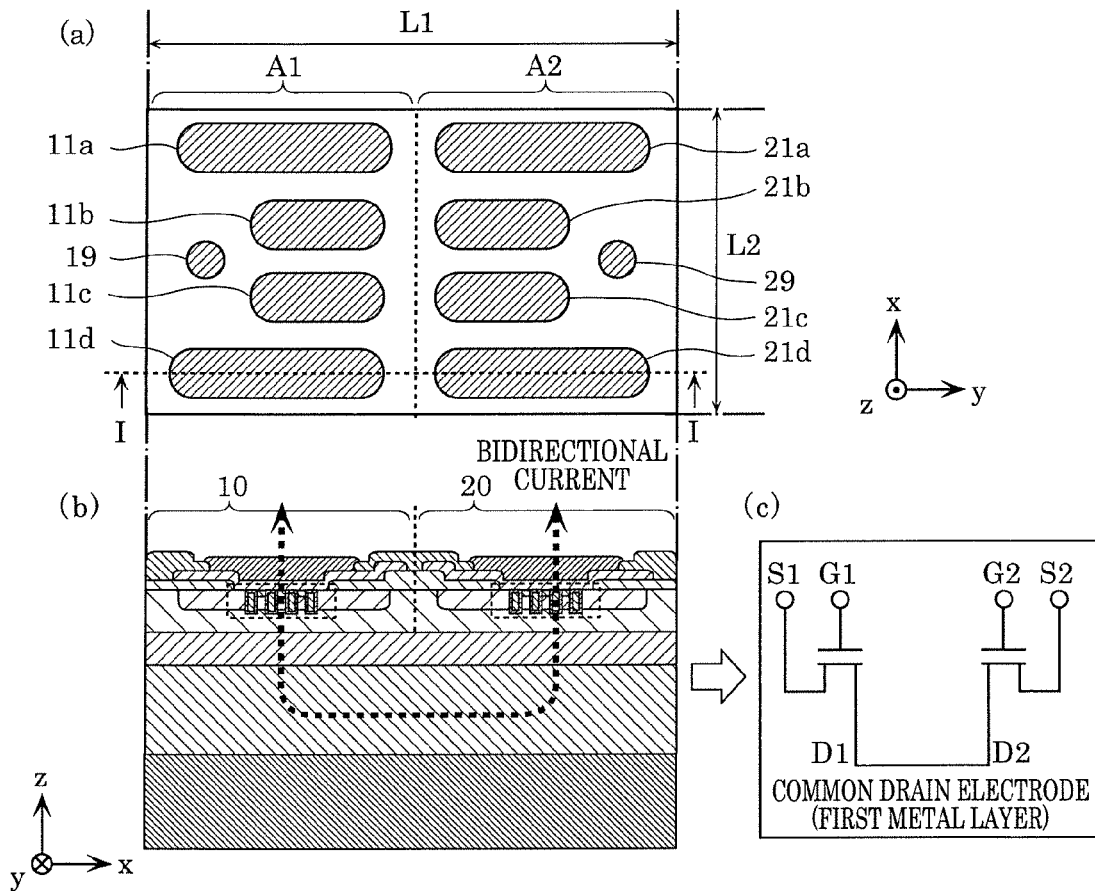
FIG. 2 includes a top view illustrating one example of an electrode configuration of a semiconductor device according to an embodiment and a cross-sectional schematic view illustrating the flow of bidirectional current in the semiconductor device.

FIG. 1 is a cross-sectional view showing an example of the configuration of semiconductor device 1 according to an embodiment. FIG. 2 includes a top view illustrating one example of an electrode configuration of semiconductor device 1 according to an embodiment and a cross-sectional schematic view illustrating the flow of bidirectional current in semiconductor device 1 according to an embodiment. The cross-sectional view of FIG. 1 shows the plane taken along line I-I in (a) in FIG. 2.

As illustrated in FIG. 1, semiconductor device 1 includes semiconductor layer 40, metal layers 30 and 31, first vertical MOS transistor 10 (hereinafter referred to as transistor 10), and second vertical MOS transistor 20 (hereinafter referred to as transistor 20).

Semiconductor layer 40 includes principal surface 40a (first principal surface) and principal surface 40b (second principal surface) that face in opposite directions, and comprises silicon. Semiconductor layer 40 has a configuration in which semiconductor substrate 32 and low-concentration impurity layer 33 are layered on each other. Semiconductor substrate 32 is disposed on the side facing principal surface 40b of semiconductor layer 40, and low-concentration impurity layer 33 is disposed on the side facing principal surface 40a of semiconductor layer 40.

Metal layer 31 is a first metal layer that includes principal surface 31a (third principal surface) and principal surface 31b (fourth principal surface) that face in opposite directions, is disposed with principal surface 31a in contact with principal surface 40b, is thicker than semiconductor layer 40, and comprises a first metal material. Examples of the first metal material may include silver (Ag), copper (Cu), and gold (Au).

Metal layer 30 is a second metal layer that includes principal surface 30a (fifth principal surface) and principal surface 30b (sixth principal surface) that face in opposite directions, is disposed with principal surface 30a in contact with principal surface 31b, is thicker than semiconductor layer 40, and comprises a second metal material having a Young's modulus greater than that of the first metal material. Examples of the second metal material may include nickel (Ni), platinum (Pt), iridium (Ir), rhodium (Rh), and chromium (Cr).

Moreover, as illustrated in FIG. 1 as well as (a) and (b) in FIG. 2, in a plan view of semiconductor layer 40, transistor 10 formed in first region A1 includes, on the principal surface 40a side of semiconductor layer 40, four source electrodes 11a, 11b, 11c, and 11d (each corresponding to one of source electrodes 11), and one gate electrode 19 (first gate electrode). Moreover, transistor 20 formed in second region A2 adjacent to first region A1 in a direction along principal surface 40a includes four source electrodes 21a, 21b, 21c, and 21d (each corresponding to one of source electrodes 21), and one gate electrode 29 (second gate electrode). The number of source electrodes and gate electrodes included in one transistor 10 and one transistor 20 and the arrangement of the source and gate electrodes are not limited to those shown in FIG. 2.

Metal layer 31 functions as a common drain electrode for transistors 10 and 20, as shown in (b) and (c) in FIG. 2, and a bidirectional path from source electrodes 11 (first source electrode) to source electrodes 21 (second source electrode) via metal layer 31 is a primary current path.

The configuration described above, in which metal layer 31 having a thickness for ensuring low on-resistance is in contact with metal layer 30 having a Young's modulus greater than that of metal layer 31 and thicker than semiconductor layer 40, can suppress warpage of semiconductor device 1 that occurs due to the contact between semiconductor layer 40 and metal layer 31. Chip-size-package-type semiconductor device 1 that allows both reduction in on-resistance and suppression of warpage can therefore be provided.

The configuration and effects of semiconductor device 1 will be described below in detail.

Semiconductor substrate 32 contains an impurity of a first conductivity type and comprises silicon. Semiconductor substrate 32 is, for example, an n-type silicon substrate.

Low-concentration impurity layer 33 is formed to be in contact with the upper surface (principal surface facing positive side of axis z in FIG. 1) of semiconductor substrate 32 and contains an impurity of the first conductivity type in lower a concentration than the concentration of an impurity of the first conductivity type in semiconductor substrate 32. Low-concentration impurity layer 33 may be formed on semiconductor substrate 32, for example, in an epitaxial growth process.

Body region 18, which contains an impurity of a second conductivity type different from the first conductivity type, is formed in first region A1 of low-concentration impurity layer 33. Source region 14 containing an impurity of the first conductivity type, gate conductor 15, and gate insulating film 16 are formed in body region 18. Source electrode 11 is formed of portion 12 and portion 13, and portion 12 is connected to source region 14 and body region 18 via portion 13. Gate conductor 15 is connected to gate electrode 19.

Portion 12 of source electrode 11 is a layer showing satisfactory bondability to an electrically conductive bonding material, such as solder, in an implementation process and may comprise a metal material containing at least one of nickel, titanium, tungsten, and palladium, as a non-limiting example. The surface of portion 12 may be plated, for example, with gold.

Portion 13 of source electrode 11 is a layer that connects portion 12 and semiconductor layer 40 to each other and may comprise a metal material containing at least one of aluminum, copper, gold, and silver, as a non-limiting example.

Body region 28, which contains an impurity of the second conductivity type different from the first conductivity type, is formed in second region A2 of low-concentration impurity layer 33. Source region 24 containing an impurity of the first conductivity type, gate conductor 25, and gate insulating film 26 are formed in body region 28. Source electrode 21 is formed of portion 22 and portion 23, and portion 22 is connected to source region 24 and body region 28 via portion 23. Gate conductor 25 is connected to gate electrode 29.

Portion 22 of source electrode 21 is a layer showing satisfactory bondability to an electrically conductive bonding material, such as solder, in an implementation process and may comprise a metal material containing at least one of nickel, titanium, tungsten, and palladium, as a non-limiting example. The surface of portion 22 may be plated, for example, with gold.

Portion 23 of source electrode 21 is a layer that connects portion 22 and semiconductor layer 40 to each other and may comprise a metal material containing at least one of aluminum, copper, gold, and silver, as a non-limiting example.

Body regions 18 and 28 are covered with interlayer insulating film 34 having openings, and portions 13 and 23, which are part of the source electrodes and connected to source regions 14 and 24, respectively, via the openings of interlayer insulating film 34, are provided. Interlayer insulating film 34 and portions 13 and 23 of the source electrodes are covered with passivation layer 35 having openings, and portions 12 and 22, which are connected to portions 13 and 23 of the source electrodes, respectively, via the openings of passivation layer 35, are provided.

[2. Operation of Semiconductor Device]

In semiconductor device 1 shown in FIG. 1, for example, assuming that the first conductivity type is the n type and the second conductivity type is the p type, source regions 14 and 24, semiconductor substrate 32, and low-concentration impurity layer 33 may comprise an n-type semiconductor, and body regions 18 and 28 may comprise a p-type semiconductor.

Moreover, for example, assuming that the first conductivity type is the p type and the second conductivity type is the n type, source regions 14 and 24, semiconductor substrate 32, and low-concentration impurity layer 33 may comprise a p-type semiconductor, and body regions 18 and 28 may comprise an n-type semiconductor.

In the following description, the electric conduction operation of semiconductor device 1 will be described with reference to what is called an N-channel transistor with the first conductivity type being the n type and the second conductivity type being the p type.

In semiconductor device 1 shown in FIG. 1, when high voltage is applied to source electrodes 11 and low voltage is applied to source electrodes 21, and voltage greater than or equal to a threshold is applied to gate electrode 29 (gate conductor 25) with respect to the voltage at source electrode 21, a conduction channel is formed in the vicinity of gate insulating film 26 in body region 28. As a result, on-current flows through the following path: source electrode 11-body region 18-low-concentration impurity layer 33-semiconductor substrate 32-metal layer 31-semiconductor substrate 32-low-concentration impurity layer 33-the conduction channel formed in body region 28-source region 24-source electrode 21, so that semiconductor device 1 is electrically conductive. PN junction is present in the conduction path at the plane where body region 18 and low-concentration impurity layer 33 are in contact with each other, and the PN junction functions as a body diode. Since the on-current flows through metal layer 31, increasing the thickness of metal layer 31 increases the cross-sectional area of the on-current path, whereby the on-resistance of semiconductor device 1 can be lowered. The electrical conduction state is the charge state in FIG. 3, which will be described later.

[3. Configuration that Achieves Both Warpage Reduction and Low On-Resistance of Semiconductor Device]

Figure 3:
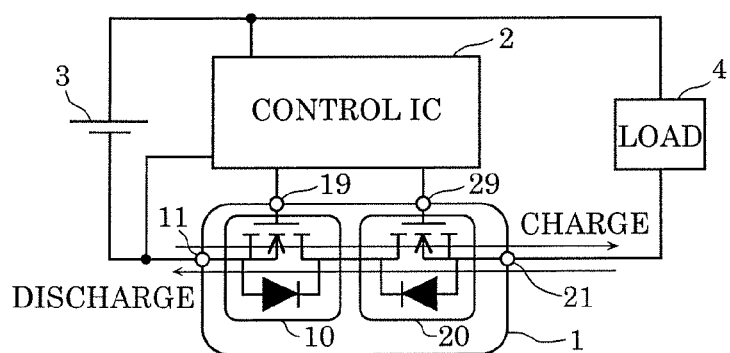
FIG. 3 is a circuit diagram illustrating an example of an application of a semiconductor device according to an embodiment in a charge/discharge circuit.

FIG. 3 is a circuit diagram illustrating an example of an application of semiconductor device 1 in a charge/discharge circuit of a smartphone or tablet. Semiconductor device 1 controls discharging operations from battery 3 to load 4 and charging operations from load 4 to battery 3 depending on the control signal applied by control IC 2. When semiconductor device 1 is implemented as a charge/discharge circuit in a smartphone or tablet in this way, the on-resistance is required to be lower than or equal to a value in a range of from 2.2 mΩ to 2.4 mΩ as a 20 V withstand voltage specification, due to a short charge period, rapid charging, and other restrictions.

In a case where semiconductor device 1 is mounted on a mounting substrate, source electrodes 11, gate electrode 19, source electrodes 21, and gate electrode 29 are bonded to electrodes provided on the mounting substrate via an electrically conductive bonding material, such as solder, in facedown mounting. In this case, as the warpage of semiconductor device 1 increases, the electrical connection of source electrodes 11, gate electrode 19, source electrodes 21, and gate electrode 29 to the electrodes provided on the mounting substrate becomes less stable. That is, to further stabilize the bonding between semiconductor device 1 and the electrodes on the mounting substrate, the warpage of semiconductor device 1 needs to be reduced.

Figure 4A:
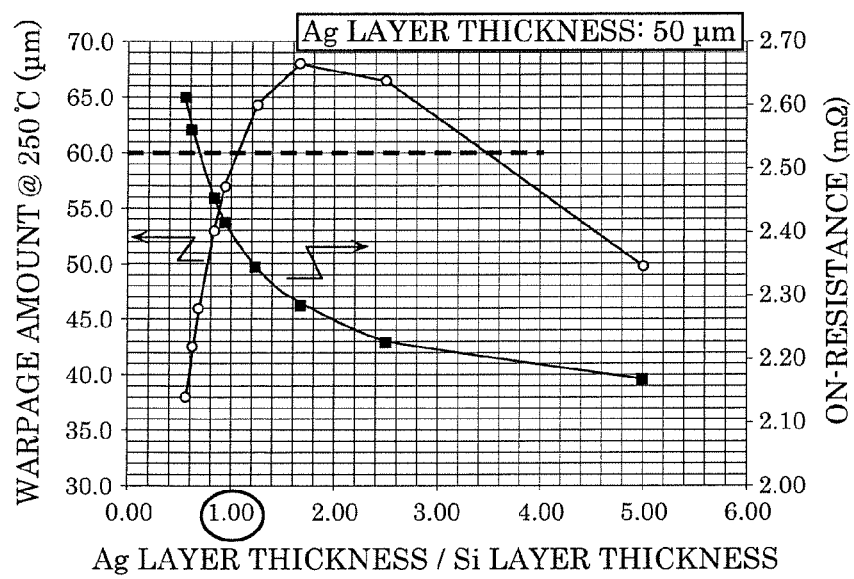
FIG. 4A shows a graph illustrating the amount of warpage and the magnitude of on-resistance of a semiconductor device having a layered configuration formed of an Si layer/Ag layer versus the thickness of an Ag layer/thickness of an Si layer.

FIG. 4A shows a graph of results of a prototype experiment for checking the amount of warpage and the magnitude of on-resistance of a semiconductor device having a layered configuration formed of semiconductor layer 40 (hereinafter referred to as Si layer in some cases)/metal layer 31 (hereinafter referred to as Ag layer in some cases) versus the thickness of the Ag layer/thickness of the Si layer (quotient of division of thickness of Ag layer by thickness of Si layer). More specifically, FIG. 4A shows the amount of warpage at 250° C. and the magnitude of on-resistance of the semiconductor device having a longer-side length of 3.40 mm (L1 in FIG. 2) and a shorter-side length of 1.96 mm (L2 in FIG. 2). FIG. 4A indicates that the thickness of the Ag layer/thickness of the Si layer that achieves on-resistance lower than or equal to 2.4 mΩ needs to be greater than 1.0. On the other hand, over the range where the thickness of the Ag layer/thickness of the Si layer is greater than 1.0, the amount of warpage at 250° C. is not smaller than or equal to 60 μm, which is the industry standard.

In contrast, metal layer 30 (hereinafter referred to as Ni layer in some cases) is provided to suppress the warpage of semiconductor device 1 with low on-resistance of semiconductor device 1 ensured. This is a structure in which semiconductor layer 40 and metal layer 30 sandwich metal layer 31, and from the viewpoint of balance of the stress at the opposite surfaces of metal layer 31, it is desirable for suppression of the amount of warpage that the material of metal layer 30 has physical properties comparable to those of the material of semiconductor layer 40 and the thickness of metal layer 30 is comparable to that of semiconductor layer 40. However, such a metal material does not exist, and it is therefore at least necessary that the material of metal layer 30 has physical properties closer to those of semiconductor layer 40 than those of metal layer 31, and that metal layer 30 is thicker than semiconductor layer 40.

Table 1 shows typical film thicknesses and physical properties of the Si layer, the Ag layer, and the Ni layer, which are examples of semiconductor layer 40, metal layer 31, and metal layer 30.

TABLE 1

|  | Film thickness (μm) | Young's modulus (GPa) | Coefficient of thermal expansion (ppm) | Manufacturing method |
| --- | --- | --- | --- | --- |
| Si layer | 20 (t1) | 185 (E1) | 3-5 (α1) |  |
| Ag layer | 50 (t2) | 83 (E2) | 18.9 (α2) | Electroplating |
| Ni layer | 30 (t3) | 200 (E3) | 12.8 (α3) | Electroplating |
|  | t1 < t2 | E3 > E2 | α3 < α2 |  |
|  | t1 < t3 |  |  |  |

A Young's modulus of the second metal material included in the Ni layer is greater than a Young's modulus of the first metal material included in the Ag layer, as shown in Table 1. The Ni layer is thicker than the Si layer, and the Ag layer is thicker than the Si layer. Further, the coefficient of thermal expansion of the second metal material included in the Ni layer is less than the coefficient of thermal expansion of the first metal material included in the Ag layer. The warpage of semiconductor device 1 can be further suppressed because the coefficient of thermal expansion of the Ni layer is less than the coefficient of thermal expansion of the Ag layer.

Figure 4B:
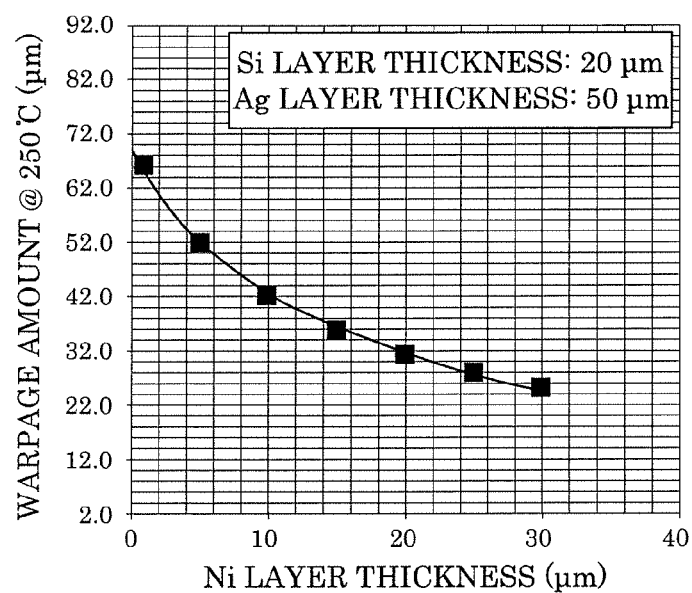
FIG. 4B shows a graph of results of a prototype experiment for checking the amount of warpage of the semiconductor device having a layered configuration formed of an Si layer/Ag layer/Ni layer versus the thickness of the Ni layer.

FIG. 4B shows a graph of results of a prototype experiment for checking the amount of warpage of semiconductor device 1 having the layered configuration formed of the Si layer/Ag layer/Ni layer versus the thickness of the Ni layer. More specifically, FIG. 4B shows a graph of computer-simulated results of expected amounts of warpage at 250° C. versus the thickness of the Ni layer in a case where the Si layer has a thickness of 20 μm and the Ag layer has a thickness of 50 μm.

In a state in which no Ni layer is present (thickness of Ni layer=0 μm), the amount of warpage is about 67 μm, but the amount of warpage decreases as the thickness of the Ni layer increases, as shown in FIG. 4B. To fully suppress the warpage-related mounting problem, the amount of warpage needs to be reduced to about 30 μm. To this end, the Ni layer is desirably thicker than the Si layer.

The results shown in FIGS. 4A and 4B indicate that, to achieve both the reduction in the amount of warpage and low on-resistance, the Ag layer needs to be thicker than the Si layer and the Ni layer needs to be thicker than the Si layer in semiconductor device 1 having the layered configuration formed of the Si layer/Ag layer/Ni layer.

The layered configuration that can achieve both the reduction in the amount of warpage and low on-resistance will next be described.

Figure 5A:
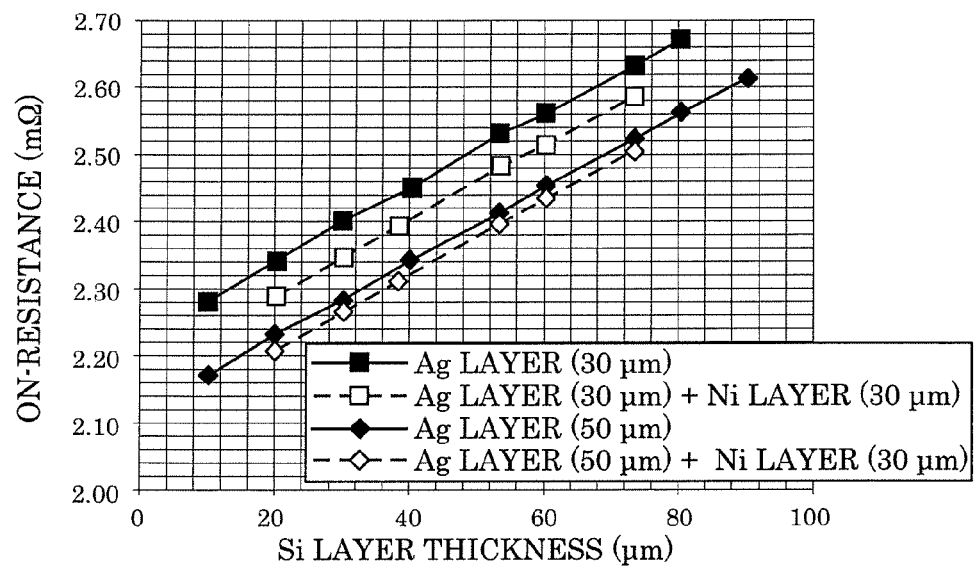
FIG. 5A shows a graph of results of a prototype experiment for checking the on-resistance of the semiconductor device having the layered configuration formed of the Si layer/Ag layer/Ni layer or the Si layer/Ag layer versus the thickness of the Si layer.

FIG. 5A shows a graph of results of a prototype experiment for checking the on-resistance of the semiconductor device having the layered configuration formed of the Si layer/Ag layer/Ni layer or the Si layer/Ag layer versus the thickness of the Si layer. More specifically, FIG. 5A shows a graph illustrating the on-resistance of the semiconductor device having the layered configuration formed of the Si layer/Ag layer versus the thickness of the Si layer in a case where the Ag layer has thicknesses of 30 μm and 50 μm. In addition, FIG. 5A shows a graph illustrating the on-resistance of the semiconductor device having the layered configuration formed of the Si layer/Ag layer/Ni layer versus the thickness of the Si layer in a case where the Ag layer has the thickness of 30 μm and the Ni layer has a thickness of 30 μm and in a case where the Ag layer has the thickness of 50 μm and the Ni layer has the thickness of 30 μm.

The on-resistance of each of the semiconductor devices decreases as the thickness of the Si layer decreases, as shown in FIG. 5A. It is, however, noted that a thinner Si layer allows reduction in on-resistance but causes an increase in variation in film thickness on a semiconductor substrate wafer, local fracturing and cracking, and other manufacturing-step-related problems. It is therefore difficult to stably reduce the thickness of the Si layer to a value smaller than 20 μm. There are a tendency for the on-resistance to decrease as the thickness of the Ag layer increases and a tendency for the on-resistance to decrease when the Ni layer is added.

Figure 5B:
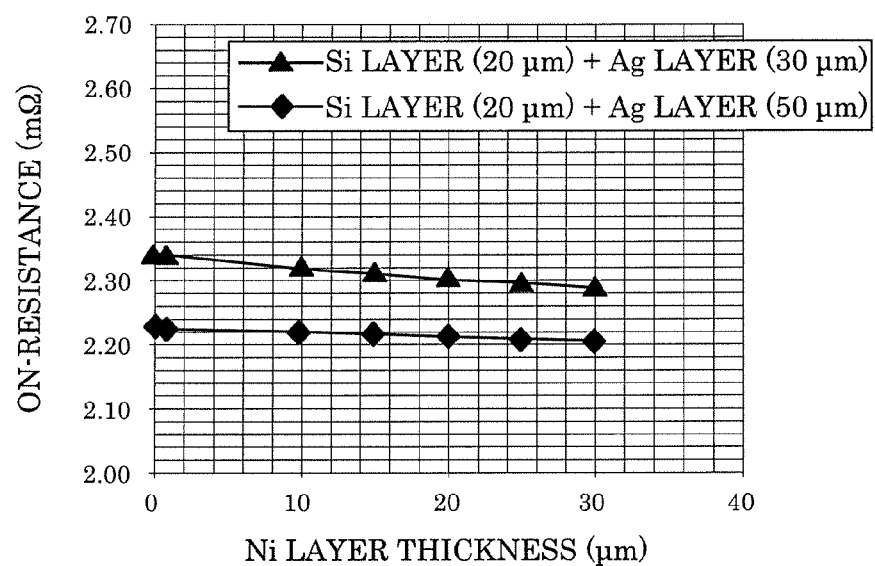
FIG. 5B shows a graph of results of a prototype experiment for checking the on-resistance of the semiconductor device having the layered configuration formed of the Si layer/Ag layer/Ni layer versus the thickness of the Ni layer.

FIG. 5B shows a graph of results of a prototype experiment for checking the on-resistance of the semiconductor device having the layered configuration formed of the Si layer/Ag layer/Ni layer versus the thickness of the Ni layer. More specifically, FIG. 5B shows a graph illustrating the on-resistance versus the thickness of the Ni layer in the case of the Si layer (20 μm)/Ag layer (30 μm) and the Si layer (20 μm)/Ag layer (50 μm). FIG. 5B shows that the on-resistance of the semiconductor device slightly decreases as the thickness of the Ni layer increases, indicating that adding the Ni layer causes no increase in the on-resistance of the semiconductor device. In particular, in the case where the Si layer has the thickness of 20 μm, the Ag layer has the thickness of 30 μm, and the Ni layer has the thickness of 30 μm, the on-resistance decreases to about 2.3 mΩ.

FIGS. 5A and 5B also show that semiconductor device 1 having the layered configuration formed of the Si layer/Ag layer/Ni layer with the Ag layer being thicker than the Si layer and the Ni layer being thicker than the Si layer allows both the reduction in the amount of warpage and low on-resistance.

[4. Microscopic Configuration of Semiconductor Device]

In semiconductor device 1 according to the present embodiment, it is desirable that the Ni layer is thicker than the Si layer and the thickness of the Si layer is greater than 20 μm, so that the Ni layer needs to be a layer having a thickness of several tens of micrometers. From this point of view, the Ni layer is formed, for example, by wet plating. Wet plating is broadly classified into electroplating and chemical plating, and the electroplating is characterized by a small degree of restriction on the film thickness and low-temperature formation of a film for a small amount of thermal influence on a device. The electroplating is therefore desirable as the method for manufacturing the Ni layer in semiconductor device 1. The method for forming the Ni layer can be dry method, such as evaporation, which has, however, a low film formation rate because the crystal grains have a size on the order of several tens of nanometers. The dry method is therefore impractical as the method for forming a thick film having a thickness of 10 μm or greater.

In the electroplating, a potential gradient moves a metal seed ionized in a solution toward the cathode, and the metal seed chemically combines with the atoms of the base material of the cathode to form a metal coating. The crystal grains of the formed metal coating therefore tend to grow into large crystal grains.

FIG. 6 shows the crystal state of the Ni layer in semiconductor device 1 according to the embodiment. (a) in FIG. 6 is an electron micrograph of principal surface 30b of the Ni layer in semiconductor device 1, and (b) in FIG. 6 is an electron micrograph of a cross section of the Ni layer in semiconductor device 1.

In (a) in FIG. 6, principal surface 30b of the Ni layer has an irregular structure formed of grains that are a plurality of aggregated crystals, and the irregular structure has a cycle ranging, for example, from 10 to 20 μm. On the other hand, (b) in FIG. 6 shows a cross-sectional structure of the Ni layer having a plurality of crystal grains grown in a direction approximately perpendicular to principal surface 30b and each having a size greater than or equal to 1 μm.

(a) and (b) in FIG. 6 show a feature of thick metal layer 30 (Ni layer) formed by electroplating and specifically show that the horizontal cycle (cycle in x-axis direction) of the irregularities of principal surface 30b of metal layer 30 (Ni layer) is greater than the horizontal grain size (size in x-axis direction) of the crystals that form the metal layer 30 (Ni layer).

The feature described above indicates that electroplating is effective as the method for forming an Ni layer thicker than the Si layer.

FIG. 7 is an electron micrograph showing a cross section of the Ni layer/Ag layer in semiconductor device 1 according to the embodiment. (a), (b), and (c) in FIG. 7 show cross sections of the Ag layer and the Ni layer formed by electroplating in a case where plating current has magnitudes of 2.1 A, 4.5 A, and 8.0 A, respectively.

It has been known as a feature of a metal film that the crystallinity of the metal film is related to the hardness of the metal film, and that a metal film formed of finer crystal grains is harder (has a greater Young's modulus). Further, in electroplating, the farther the film formation proceeds, the larger the crystal grains become. In other words, the thicker the film, the larger the crystal grains.

In semiconductor device 1 according to the present embodiment, the Ni layer/Ag layer is so formed that the Ag layer is formed on principal surface 40b of the Si layer and the Ni layer is then formed on principal surface 31b of the Ag layer. As a result, irrespective of the magnitude of the plating current, the crystal grain size in metal layer 30 (Ni layer) in the vicinity of principal surface 30a is less than the crystal grain size in metal layer 30 (Ni layer) in the vicinity of principal surface 30b, and the crystal grain size in metal layer 30 (Ni layer) in the vicinity of principal surface 30a is less than the crystal grain size in metal layer 31 (Ag layer) in the vicinity of principal surface 31b, as shown in FIG. 7.

As a result, since not only is the Ni layer having a relatively small coefficient of thermal expansion in contact with the Ag layer having a relatively large coefficient of thermal expansion but the Ni layer having a relatively small crystal grain size is in contact with the Ag layer having a relatively large crystal grain size, the Ag layer is unlikely to stretch when the temperature increases, whereby the effect of suppressing the warpage of semiconductor device 1 is enhanced.

FIG. 8 shows a graph illustrating comparison between actually measured values and estimated values of the amount of warpage of the semiconductor device having the layered configuration formed of the Si layer/Ag layer/Ni layer versus the thickness of the Ni layer. FIG. 8 shows actually measured values and estimated values of the amount of warpage in the case where the Si layer has the thickness of 20 μm and the Ag layer has the thickness of 50 μm in the layered configuration formed of the Si layer/Ag layer/Ni layer, with the actually measured values provided in a prototype experiment and the predicted values provided by a computer simulator when the thickness of the Ni layer increases. FIG. 8 shows that the actually measured values of the amount of warpage deviate from the predicted values thereof in the region where the thickness of the Ni layer is 20 μm or greater, so that the warpage suppression effect provided by an increase in the thickness of the Ni layer is degraded at the actually measured values in the region.

Increasing the thickness of the Ni layer enhances the effect of suppressing the warpage of semiconductor device 1 but prolongs the period required to form the Ni-plated layer, resulting in an increase in manufacturing cost. Further, increasing the thickness of the Ni layer increases the cutting load in the dicing step of singulation of semiconductor device 1, resulting in possible problems, such as an increase in the manufacturing cost due to a decrease in cutting speed and breakage of the dicing blade.

It is therefore desirable from the viewpoint of an effective warpage suppression effect and the manufacturing steps in relation to an increase in the thickness of the Ni layer that the thickness of the Ni layer is smaller than or equal to 30 μm. That is, it is desirable that the metal layer 30 (Ni layer) is thicker than semiconductor layer 40 (Si layer) and the thickness of the metal layer 30 (Ni layer) is smaller than or equal to 30 μm. As a result, an effective warpage suppression effect is provided, and shortening of the manufacturing steps and cost reduction can be achieved.

FIG. 9 is a schematic cross-sectional view of semiconductor devices each including an Ni layer formed of a plurality of layers containing different crystal grain sizes.

(a) in FIG. 9 shows that the crystal grains in first layer 70A including principal surface 30a are smaller than the crystal grains in second layer 70B including principal surface 30b. In the configuration described above, first layer 70A is harder than second layer 70B. Therefore, as the tendency of the warpage in the Ni layer, soft second layer 70B is likely to stretch by a greater amount than hard first layer 70A, and principal surface 30b of the Ni layer has convex warpage, the direction of which is the same as the direction of the warpage between the Si layer and the Ag layer. That is, the layered Ni layer reduces the amount of warpage of semiconductor device 1, but the effect of suppressing the warpage of the semiconductor device is degraded due to the crystal grain size distribution described above in the Ni layer.

The distribution of the crystal grain size in the Ni layer shown in (a) in FIG. 9 is a result of the formation of the Ni layer with the film formation conditions in the electroplating unchanged. The configuration of the Ni layer shown in (a) in FIG. 9 can therefore suppress the warpage of the semiconductor device while allowing the Ni layer to be formed by simplified electric plating, for example, the plating current condition is fixed.

(b) in FIG. 9 shows a state in which the crystal grain size in first layer 70C including principal surface 30a is approximately equal to the crystal grain size in second layer 70D including principal surface 30b. Further, the crystal grain size in metal layer 30 (Ni layer) is less than the crystal grain size in a portion of metal layer 31 (Ag layer) that is the portion facing principal surface 31b. The configuration described above, in which the Ni layer has uniform hardness and the Ni layer is harder than the Ag layer, can suppress the warpage of semiconductor device 1. Further, since the Ni layer, which can be the outer surface of semiconductor device 1, is harder than the Ag layer, breakage of the dicing blade in the dicing-based cutting step can be avoided, whereby the manufacturing steps are simplified.

(c) in FIG. 9 shows a state in which the crystal grain in first layer 70E including principal surface 30a is greater than the crystal grain in second layer 70F including principal surface 30b. In the configuration described above, first layer 70E is softer than second layer 70F. Therefore, as the tendency of the warpage in the Ni layer, soft first layer 70E is likely to stretch by a greater amount than hard second layer 70F, and principal surface 30a of the Ni layer has convex warpage, the direction of which is opposite the direction of the warpage between the Si layer and the Ag layer. That is, the crystal grain size distribution described above in the Ni layer enhances the effect of suppressing the warpage of semiconductor device 1. Further, since the Ni layer, which can be the outer surface of semiconductor device 1, has a hard portion facing the principal surface 30b, the dicing-based cutting step is readily carried out, whereby the manufacturing steps are simplified.

To achieve the crystal state in the first layer and the crystal state in the second layer, as shown in (b) and (c) in FIG. 9, the plating current conditions for the first and second layers may be set to differ from each other or may otherwise be individually controlled.

The relationship between the crystal orientation in metal layer 30 and the hardness thereof will next be described.

It is generally known that the physical properties of a crystal having a regular atom arrangement change in accordance with the crystal direction. The same holds true for Ni, and the physical properties of Ni change in accordance with the crystal orientation. A Young's modulus of an Ni single crystal having a <110> crystal growth direction is $2.04 \times 10^{12}$ (dyn/cm$^2$), and a Young's modulus of an Ni single crystal having a <100> crystal growth direction is $1.21 \times 10^{12}$ (dyn/cm$^2$). That is, the Ni layer having a <110> preferred orientation has a greater Young's modulus and is harder than the Ni layer having a <100> preferred orientation.

In a case where an Ni layer is formed by using electroplating, it is known that the crystal orientation of the Ni layer changes in accordance with the solution used in the electroplating. For example, an Ni layer formed by using a sulfuric acid bath or a Watts bath has a crystal growth direction that coincides with the <110> preferred orientation over a relatively high plating current density range, and an Ni layer formed by using a sulfamic acid bath has a crystal growth direction that coincides with the <100> preferred orientation.

FIG. 10 shows the temperature dependence of the amount of warpage of a semiconductor device including an Ni layer formed of two layers formed by using different plating methods. (a) in FIG. 10 is a cross-sectional view of a layered configuration in which a first layer (having thickness of 15 µm) formed by using a sulfamic acid bath and a second layer (having thickness of 15 µm) formed by using a sulfuric acid bath are formed in the presented order from the side facing principal surface 31b of the Ag layer (having thickness of 50 µm). (b) in FIG. 10 shows the temperature dependence of the amount of warpage in a configuration in which the Ag layer (having thickness of 50 µm) and the first layer (having thickness of 30 µm) are layered on each other, the temperature dependence of the amount of warpage in a configuration in which the Ag layer (having thickness of 50 µm) and the second layer (having thickness of 15 µm) are layered on each other, and the temperature dependence of the amount of warpage in a configuration in which the Ag layer (having thickness of 50 µm), the first layer (having thickness of 15 µm), and the second layer (having thickness of 15 µm) are layered on each other.

According to the findings described above, since the first layer (sulfamic acid Ni) has a crystal growth direction (direction toward negative side of axis z) that coincides with the <100> preferred orientation and the second layer (sulfuric acid Ni) has a crystal growth direction (direction toward negative side of axis z) that coincides with the <110> preferred orientation, a Young's modulus of the second layer is greater than a Young's modulus of the first layer. The amount of warpage of the second layer therefore tends to be smaller than the amount of warpage of the first layer, and the upper limit of the amount of warpage lowers in a high-temperature region. The lower limit of the amount of warpage in a low-temperature region, however, strongly tends to lower and reaches a negative region, so that the range between the upper and lower limits of the amount of warpage of the first layer is narrower than that of the second layer. Layering the first and second layers having different characteristics of the amount of warpage on each other allows the upper limit of the amount of warpage in the high-temperature region to be smaller than that of the first layer and the lower limit (value in negative region) of the amount of warpage in the low-temperature region to be greater than that of the second layer.

The term "preferred crystal orientation" is also called, for example, a <110> preferred orientation (or {110}-plane preferred orientation), indicates that the ratio of a crystal having a predetermined crystal orientation (or crystal plane) to the entire crystal per unit volume or area is maximized, and can be determined by using X-ray diffraction or backscattered electron diffraction.

According to the configuration described above, metal layer 30 (Ni layer) includes the first layer including principal surface 30a and the second layer including principal surface 30b, and the metal crystal included in the first layer and the metal crystal included in the second layer may have different preferred orientation planes in the horizontal direction of principal surface 30b.

The amount (the absolute value and range of the amount) of warpage and other parameters of semiconductor device 1 are thus readily controlled.

In the horizontal direction of principal surface 30b, the metal crystal included in one of the first and second layers may have the {100}-plane preferred orientation, and the metal crystal included in the other one of the first and second layers may have the {110}-plane preferred orientation.

The amount (the absolute value and range of the amount) of warpage and other parameters of semiconductor device 1 are thus readily controlled.

The metal crystal included in the metal layer 30 (Ni layer) may have the {100}-plane preferred orientation in principal surface 30b irrespective of whether metal layer 30 (Ni layer) is formed of a single layer or a plurality of layers having different crystal orientations.

In this case, since a Young's modulus in the {100} plane is less than a Young's modulus in the 11101 plane, laser marking in a marking step is readily performed.

The metal crystal included in the metal layer 30 (Ni layer) may have the {110}-plane preferred orientation in principal surface 30b irrespective of whether metal layer 30 (Ni layer) is formed of a single layer or a plurality of layers having different crystal orientations.

In this case, since a Young's modulus in the {110} plane is greater than a Young's modulus in the {100} plane, the suppression of the warpage of semiconductor device 1 can be enhanced.

[5. Visibility of Mark on Semiconductor Device]

Semiconductor device 1 according to the present embodiment further includes a mark formed on principal surface 30b of metal layer 30 (Ni layer). The mark described above is, for example, a mark including identification information, such as the product name and the date of manufacture. In semiconductor device 1, the mark is formed on principal surface 30b, for example, by laser radiation so that extrinsic visual recognition of the mark is readily allowed even after facedown mounting. A YAG laser is frequently used as the laser used to perform the laser radiation described above. A YAG laser is capable of minute marking on a metal material representatively including a resin material.

The visibility of the mark formed on principal surface 30b of the Ni layer is greatly affected by the state of the surface of the Ni layer. Radiating laser onto principal surface 30b of the Ni layer reconfigures the grain boundary in a region of principal surface 30b that is the region to which the laser is radiated and therefore changes the state of principal surface 30b. The relationship of the width (a pattern width of the mark) and depth (a pattern depth of the mark) of a line of the mark where the state of the surface has changed with the state of the surface in a region of principal surface 30b that is the region other than the line of the mark determines the visibility of the mark. Examples of deterioration of the visibility of the mark may include a case where it is difficult to identify the mark due, for example, to loss and blur of a marked letter or line.

FIG. 11 is a schematic cross-sectional view of the semiconductor device and shows the relationship of the cycle of irregularities of principal surface 30b of the Ni layer and the width of the mark pattern with the visibility of the mark. In a case where the width of the pattern (in x-axis direction) in the line of the mark where the state of the surface has changed due to the radiation of the laser is less than the cycle of the irregularities of principal surface 30b of the Ni layer, as shown in FIG. 11, the mark is visually unrecognizable and is therefore determined as defective. In contrast, in a case where the width of the pattern in the line of the mark described above is greater than the cycle of the irregularities of principal surface 30b of the Ni layer, the mark is visually recognizable and is therefore determined as satisfactory.

FIG. 12 shows the relationship of the mean roughness depth of principal surface 30b of the Ni layer and the depth of the mark with the visibility of the mark. In a case where the depth of the mark (in z-axis direction) in the line of the mark where the state of the surface has changed due to the radiation of the laser is less than a mean roughness depth Rz of principal surface 30b of the Ni layer, as shown in FIG. 12, the mark is visually unrecognizable and is therefore determined as defective. In contrast, in a case where the depth of the mark in the line of the mark described above is greater than the mean roughness depth Rz of principal surface 30b of the Ni layer, the mark is visually recognizable and is therefore determined as satisfactory.

[6. Configuration of End Portion of Semiconductor Device]

FIG. 13A is a cross-sectional view of semiconductor device 1A according to an embodiment. Semiconductor device 1A includes semiconductor layer 40 (Si layer), metal layers 30 (Ni layer) and 31 (Ag layer), transistors 10 and 20, and protrusions 36A, 36B, 37A and 37B, as shown in FIG. 13A. Semiconductor device 1A differs from semiconductor device 1 according to the embodiment in that semiconductor device 1A includes protrusions 36A, 36B, 37A and 37B, and that the outer periphery of the Si layer is closer to the center of semiconductor device 1A than the outer periphery of the Ni layer and the Ag layer in the plan view of the Si layer. Semiconductor device 1A will be described below primarily on the different points with no description of the same points as those of semiconductor device 1.

In the plan view of semiconductor layer 40 (Si layer), the outer periphery of semiconductor layer 40 (Si layer) is closer to the center of semiconductor device 1A than the outer peripheries of metal layers 30 (Ni layer) and 31 (Ag layer). This results from the fact that the step of singulation of semiconductor device 1A is formed of two cutting steps (step of cutting Si layer and step of cutting Ni and Ag layers). In semiconductor device 1A, the configuration in which the outer periphery of the Si layer is closer to the center than the outer peripheries of the Ni and Ag layers is not essential.

In the plan view of metal layer 30 (Ni layer) from the side facing principal surface 30b, protrusions 36A and 36B are each a first protrusion that is located in the outer periphery of the Ni layer and protrudes from principal surface 30b in the direction from principal surface 30a toward principal surface 30b (direction toward negative side of z-axis direction). Protrusions 36A and 36B contain at least one of the first metal material that metal layer 31 contains and the second metal material that metal layer 30 contains. In semiconductor device 1A, protrusions 36A and 36B contain at least one of Ag and Ni.

The mechanical strength and hardness of the Ni layer along the outer periphery thereof can therefore be increased, whereby the suppression of the warpage of semiconductor device 1A can be enhanced.

Protrusions 36A and 36B may be formed on two sides facing each other out of the sides that form the outer periphery of metal layer 30 (Ni layer) or all sides that form the outer periphery of metal layer 30 (Ni layer) in the plan view described above.

The suppression of the warpage of semiconductor device 1A in the direction perpendicular to the direction in which protrusions 36A and 36B are formed can therefore be enhanced.

The protruding height of protrusions 36A and 36B is, for example, at least one-third the thickness of metal layer 30 (Ni layer).

The mechanical strength and hardness of the Ni layer along the outer periphery thereof can therefore be increased.

The protruding width of protrusions 36A and 36B is, for example, at least 4 μm.

Therefore, the mechanical strength and hardness of the Ni layer along the outer periphery thereof can be increased, and a breakaway of protrusions 36A and 36B from semiconductor device 1A in a cleaning step can be avoided, whereby a short circuit and other defects that occur in semiconductor device 1A due to an electrically conductive object having broken away can be avoided.

In protrusions 36A and 36B, the content of the second metal material is greater than the content of the first metal material. In semiconductor device 1A, the Ni content is greater than the Ag content in protrusions 36A and 36B.

Protrusions 36A and 36B are therefore relatively hard protrusions because they contain a large amount of Ni, a Young's modulus of which is greater than that of Ag. Therefore, the mechanical strength and hardness of metal layer 30 along the outer periphery thereof can be increased, and a breakaway of protrusions 36A and 36B from semiconductor device 1A in a cleaning step can be avoided, whereby a short circuit and other defects that occur in semiconductor device 1A due to an electrically conductive object having broken away can be avoided.

In semiconductor device 1A, protrusions 36A and 36B are not an essential configuration.

In the plan view of semiconductor layer 40 (Si layer), the outer periphery of semiconductor layer 40 (Si layer) is formed inside the outer periphery of metal layer 31 (Ag layer) with a gap between the two outer peripheries.

In the plan view of metal layer 31 (Ag layer) viewed from the side facing principal surface 31a, protrusions 37A and 37B are each a second protrusion that is located at the outer periphery of metal layer 31 (Ag layer) and protrudes from principal surface 31a in the direction from principal surface 31b toward principal surface 31a (direction toward positive side of z-axis direction). Protrusions 37A and 37B contain at least one of the first metal material that metal layer 31 (Ag layer) contains and the second metal material that metal layer 30 (Ni layer) contains. In semiconductor device 1A, protrusions 37A and 37B contain at least one of Ag and Ni.

The mechanical strength and hardness of the Ag layer along the outer periphery thereof can therefore be increased, whereby the suppression of the warpage of semiconductor device 1A can be enhanced.

Protrusions 37A and 37B may be formed on two sides facing each other out of the sides that form the outer periphery of metal layer 31 (Ag layer) or all sides that form the outer periphery of metal layer 31 (Ag layer) in the plan view described above.

The suppression of the warpage of semiconductor device 1A in the direction perpendicular to the direction in which protrusions 37A and 37B are formed can therefore be enhanced.

In semiconductor device 1A, protrusions 37A and 37B are not an essential configuration.

In semiconductor device 1A, protrusions 36A, 36B, 37A and 37B are each made of the material included in metal layer 30 (Ni layer) or metal layer 31 (Ag layer) and extends from the outer periphery of metal layer 30 (Ni layer) or metal layer 31 (Ag layer) in the step of singulation of semiconductor device 1A.

In the step of singulation of semiconductor device 1A, blade dicing is, for example, used. The blade dicing is the process of cutting the Si layer, the Ni layer, and the Ag layer by rotating at high speed a circular blade to which diamond grindstones are attached and which has a width of about several tens of micrometers. In this process, the circular blade first cuts the Si layer and travels toward the Ni layer and removes the material of each of the layers by the amount corresponding approximately to the width of the circular blade (several tens of micrometers). The Ni and Ag layers, which are ductile, are therefore stretched in the direction in which the circular blade performs the cutting, so that protrusions (burrs) are formed as part of the Ni and Ag layers. The protrusions form new, approximately flat surfaces in the direction perpendicular to the surfaces of the Ni and Ag layers and serve as portions that reinforce the Ni and Ag layers. The suppression of warpage of semiconductor device 1A can therefore be enhanced.

FIG. 13B is a cross-sectional view of semiconductor device 1B according to an embodiment. Semiconductor device 1B includes semiconductor layer 40 (Si layer), metal layers 30 (Ni layer) and 31 (Ag layer), and protrusions 36B, 37B, and 38, as shown in FIG. 13B. Semiconductor device 1B differs from semiconductor device 1A in that semiconductor device 1B includes protrusion 38. Semiconductor device 1B will be described below primarily on the different point with no description of the same points as those of semiconductor device 1A.

Protrusion 38 is a third protrusion formed in the outer peripheral surface of metal layer 31 (Ag layer) in the direction from the center of metal layer 31 (Ag layer) toward the outer periphery thereof (direction toward positive side of x-axis direction) in the plan view of metal layer 31 (Ag layer). Protrusion 38 may instead be formed on the outer peripheral surface of the Ni layer in the direction from the center of the Ni layer toward the outer periphery thereof (direction toward positive side of x-axis direction) in the plan view of the Ni layer.

The mechanical strength and hardness of the Ni layer along the outer periphery thereof can therefore be increased, whereby the suppression of the warpage of semiconductor device 1B can be enhanced.

FIG. 13C is a cross-sectional view of semiconductor device 1C according to an embodiment. Semiconductor device 1C includes semiconductor layer 40 (Si layer), metal layers 30 (Ni layer) and 31 (Ag layer), cover layer 50, protrusion 37A (not shown), and protrusion 37B, as shown in FIG. 13C. Semiconductor device 1C differs from semiconductor device 1A in that semiconductor device 1C includes no protrusion 36A or 36B but cover layer 50. Semiconductor device 1C will be described below primarily on the different points with no description of the same points as those of semiconductor device 1A.

Cover layer 50 is a first cover layer that includes principal surface 50a (seventh principal surface) and principal surface 50b (eighth principal surface), which face in opposite directions, is disposed with principal surface 50a in direct contact with principal surface 30b of the Ni layer or formed via a bonding material, and comprises a ceramic or plastic material.

Cover layer 50 has been already disposed before the step of singulation of semiconductor device 1C. Cover layer 50 can prevent creation of protrusions (burrs) on principal surface 30b of the Ni layer in the singulation step using blade dicing.

FIG. 13D is a cross-sectional view of semiconductor device 1D according to an embodiment. Semiconductor device 1D includes semiconductor layer 40 (Si layer), metal layers 30 (Ni layer) and 31 (Ag layer), and cover layers 50 and 51, as shown in FIG. 13D. Semiconductor device 1D differs from semiconductor device 1C in that semiconductor device 1D includes no protrusion 37A or 37B but cover layer 51. Semiconductor device 1D will be described below primarily on the different points with no description of the same points as those of semiconductor device 1C.

Cover layer 51 is a second cover layer that is located on an outer edge portion of metal layer 31 (Ag layer) in the plan view of metal layer 31 (Ag layer), includes principal surface 51a (ninth principal surface) and principal surface 51b (tenth principal surface), which face in opposite directions, is disposed with principal surface 51b in direct contact with principal surface 31a of metal layer 31 (Ag layer) or formed via a bonding material, and comprises a ceramic or plastic material.

Cover layer 51 has been already disposed before the step of singulation of semiconductor device 1D. Cover layer 51 can prevent creation of protrusions (burrs) on principal surface 31a of the Ag layer in the singulation step using blade dicing.

FIG. 13E is a cross-sectional view of semiconductor device 1E according to an embodiment. Semiconductor device 1E includes semiconductor layer 40 (Si layer), metal layers 30 (Ni layer) and 31 (Ag layer), cover layer 50, and groove 60, as shown in FIG. 13E. Semiconductor device 1E differs from semiconductor device 1D in that semiconductor device 1E includes no cover layer 51 but groove 60, which divides the Si layer. Semiconductor device 1E will be described below primarily on the different points with no description of the same points as those of semiconductor device 1D.

Groove 60 is a groove that is formed in an outer edge portion of semiconductor layer 40 (Si layer) and along the outer periphery of semiconductor layer 40 (Si layer) and has a bottom surface that is principal surface 31a.

Groove 60 has been already formed before the step of singulation of semiconductor device 1E. Groove 60 can prevent chippings from the Si layer that reach body regions 18 and 28 in the singulation step using blade dicing.

FIG. 13F is a cross-sectional view of semiconductor device 1F according to an embodiment. Semiconductor device 1F includes semiconductor layer 40 (Si layer), metal layers 30 (Ni layer) and 31 (Ag layer), and combined object 39, as shown in FIG. 13F. Semiconductor device 1F differs from semiconductor device 1 in that semiconductor device 1F includes combined object 39. Semiconductor device 1F will be described below primarily on the different point with no description of the same points as those of semiconductor device 1.

Combined object 39 is a combined object that is the combination of the first metal material and the second metal material and is formed on the outer peripheral surface of metal layer 30 (Ni layer). In the present embodiment, combined object 39 is the combination of Ag and Ni.

The mechanical strength and hardness of the Ni layer along the outer periphery thereof can therefore be increased, whereby the suppression of the warpage of semiconductor device 1F can be enhanced. Combined object 39 may instead be formed on the outer peripheral surface of the Ag layer. Also in this case, the mechanical strength and hardness of the Ag layer along the outer periphery thereof can be increased, whereby the suppression of the warpage of semiconductor device 1F can be enhanced.

In the step of singulation of semiconductor device 1F, laser dicing is, for example, used as the mean for cutting the Ni and Ag layers. The combination of the first and second metal materials melted by the laser therefore adheres to the outer peripheral surfaces of the Ni and Ag layers.

In the plan view of metal layers 30 (Ni layer) and 31 (Ag layer), combined object 39 may be formed on the outer peripheral surface of at least one of metal layers 30 (Ni layer) and 31 (Ag layer) throughout the entire periphery of semiconductor device 1F.

The mechanical strength and hardness of the Ni layer or the Ag layer along the outer periphery thereof can therefore be further increased.

In the direction from principal surface 31a toward principal surface 30b (direction toward negative side of z-axis direction), the center position of combined object 39 is located, for example, between the position corresponding to half the distance from principal surface 31a to principal surface 30b and the position of principal surface 30b, as shown in FIG. 13F.

Thus formed combined object 39 can avoid adhesion of free objects that are objects that form the Ni and Ag layers scattered in the singulation step using laser dicing (hereinafter referred to as debris in some cases) to the surface of semiconductor device 1F (surface facing positive side of z-axis direction). For example, when the combined layer that is the combination of the Ni layer and the Ag layer is cut, the blade dicing is performed from the side facing principal surface 31a by a thickness equal to at least half the distance from principal surface 31a to principal surface 30b, and then the remaining thin combined layer undergoes laser dicing at low-intensity laser output from the side facing principal surface 31a or 30b. Creation of debris can thus be suppressed.

It is acceptable that protrusions 36A, 36B, 37A, 37B, and 38 and combined object 39 are continuously formed over the distance corresponding to at least one-third of each outer peripheral side of semiconductor device 1A. The configuration described above in which a protrusion or a combined object is continuously formed along each outer peripheral side of semiconductor device 1A enhances suppression of the warpage of semiconductor device 1A. Further, a protrusion or a combined object is continuously formed over the distance corresponding to at least one half or two-thirds of each outer peripheral side of semiconductor device 1A in some cases depending on the conditions of the singulation step. In this case, the suppression of the warpage of semiconductor device 1A is further enhanced.

FIG. 14 is a cross-sectional view of semiconductor device 1G according to an embodiment. Semiconductor device 1G includes semiconductor layer 40 (Si layer), metal layers 30 (Ni layer) and 31 (Ag layer), and transistors 10 and 20, as shown in FIG. 14. In the plan view of semiconductor layer 40 (Si layer), semiconductor device 1G differs from semiconductor device 1 in that the outer periphery of semiconductor layer 40 (Si layer) is closer to the center of semiconductor device 1G than the outer peripheries of metal layers 30 (Ni layer) and 31 (Ag layer). Semiconductor device 1G will be described below primarily on the different point with no description of the same points as those of semiconductor device 1.

In the plan view of semiconductor layer 40 (Si layer), the outer periphery of semiconductor layer 40 (Si layer) is formed inside the outer periphery of metal layer 31 (Ag layer) with a gap between the two outer peripheries. Further, the outer periphery of semiconductor layer 40 (Si layer) may be formed inside the outer periphery of metal layer 31 (Ag layer) with a gap between the two outer peripheries throughout the entire periphery of metal layer 31 (Ag layer).

The configuration described above has been already formed before the Ni and Ag layers are cut in the singulation step. The configuration described above can prevent chippings from the Si layer and adhesion of debris to the side surface of the Si layer when the Ni and Ag layers are diced. Further, when the Ni and Ag layers undergo blade dicing, the Si layer does not need to be cut at the same time, whereby the blade dicing cutting load can be lowered, and the dicing blade used in the dicing is readily selected. The reason for this is that the type of dicing blade suitable for cutting of the Si layer, which is made of a ceramic material, differs from the type of dicing blade suitable for cutting of the Ni and Ag layers, which are each made of a metal material.

The distance between the outer periphery of semiconductor layer 40 (Si layer) and the outer periphery of metal layer 31 (Ag layer) in the direction in the planes to which semiconductor layer 40 (Si layer) and metal layer 31 (Ag layer) belong (length of gap between outer peripheries) is, for example, at least 15 μm.

FIG. 15 describes the setback distance of the Si layer in semiconductor device 1G according to the embodiment. FIG. 15 is a cross-sectional view of the boundary region between two adjacent semiconductor devices 1G in a manufacturing step.

In the step of singulation of semiconductor device 1G, the Si layer is chipped in some cases when the Si layer undergoes the blade dicing. To avoid the chipping, it is effective to perform the singulation of semiconductor device 1G by using not only the blade dicing but plasma dicing. Plasma dicing is a dry etching method for chemically removing the Si layer based on a plasma reaction and can cut the Si layer with no chipping at a cut surface of the Si layer.

In the step of singulation of semiconductor device 1G, the plasma dicing removes the Si layer in a region that undergoes the blade dicing or laser dicing later and corresponds to a cutting width (plasma processing width in FIG. 15) that is the cutting width in the following blade dicing or laser dicing (laser processing width or blade processing width in FIG. 15) plus a margin width. The Ag and Ni layers are then cut in the blade or laser dicing. The singulation of semiconductor device 1G can thus be performed with no chipping at the outer periphery of the Si layer.

To avoid damage to the Si layer in the blade or laser dicing when the Ag and Ni layers are cut, it is necessary to set the gap between the Si layers of adjacent semiconductor devices 1G at a value greater than the laser or blade processing width. The outer periphery of each of the Si layers is thus formed inside the outer periphery of the Ag layer with a gap therefrom.

In a case where the laser or blade processing width is set at a value ranging, for example, from 30 to 35 μm and the processing width in the plasma dicing is set, for example, at 65 μm, the distance between the outer periphery of the Si layer and the outer periphery of the Ag layer (setback distance LB in FIG. 15) ranges, for example, from 15 to 17 μm, as shown in FIG. 15.

Therefore, as the step of singulation of semiconductor device 1G, singulation with no chipping at the outer periphery of the Si layer can be readily achieved by processing the Si layer in the plasma dicing and processing the Ag and Ni layers in the blade or laser dicing.

FIG. 16 is an electron micrograph of the side surface of the Si layer in semiconductor device 1G according to the embodiment. Mean roughness depth Rz of the irregularities of a first portion of the outer peripheral surface of semiconductor layer 40 (Si layer) is approximately equal to mean roughness depth Rz of the irregularities of a second portion of the outer peripheral surface of semiconductor layer 40 (Si layer), as shown in FIG. 16, the first portion being in contact with principal surface 31a and on a side facing principal surface 40b, the second portion being on a side facing principal surface 40a. The first portion of the outer peripheral surface of semiconductor layer 40 (Si layer) is not formed in the region outside the outermost periphery of the second portion of the outer peripheral surface of semiconductor layer 40 (Si layer) in the plan view of semiconductor layer 40 (Si layer). That is, no residue of semiconductor layer 40 is formed on principal surface 31a of the Ag layer.

Therefore, when the Ag and Ni layers undergo the laser dicing, adhesion of the metals that form the Ag and Ni layers to the side surface of the Si layer can be avoided.

The outer peripheral surface of semiconductor layer 40 (Si layer) may have an irregular shape containing acute vertices, as shown in FIG. 16.

In this case, the irregular shape containing acute vertices facilitates heat dissipation via the outer peripheral surface of the Si layer, whereby the heat dissipation capability of semiconductor device 1G is improved.

FIG. 17 describes the relationship between the shape of the side surface of the Si layer and the method for manufacturing the Si layer in semiconductor device 1G according to the embodiment. (a) in FIG. 17 shows the irregular shape containing acute vertices based on the shape of a mask for the plasma dicing in the plan view of the Si layer. (b) in FIG. 17 shows the state of the processing in the plasma dicing in a cross-sectional view of the Si layer. In the plasma dicing step in (b) in FIG. 17, the Si layer is processed in plasma cutting performed in multiple stages, so that irregularities containing acute vertices are formed on the side surface of the Si layer both in the y-axis direction (or x-axis direction) and the z-axis direction. Mean roughness depth Rz of the irregularities of a first portion of the outer peripheral surface of the Si layer is approximately equal to mean roughness depth Rz of the irregularities of a second portion of the outer peripheral surface of the Si layer, as shown in (b) in FIG. 17, the first portion being in contact with the Ag layer, the second portion being on the side opposite to the Ag layer. Further, the first portion of the outer peripheral surface of the Si layer is not formed in the region outside the outermost periphery of the second portion of the outer peripheral surface of the Si layer in the plan view of the Si layer.

FIG. 18 is an electron micrograph of the side surfaces of the Si layer and the Ag layer in semiconductor device 1H according to an embodiment. Semiconductor device 1H includes semiconductor layer 40 (Si layer), metal layers 30 (Ni layer) and 31 (Ag layer), transistors 10 and 20, and amorphous semiconductor 44, as shown in FIG. 18. Semiconductor device 1H differs from semiconductor device 1G in that semiconductor device 1H includes amorphous semiconductor 44. Semiconductor device 1H will be described below primarily on the different point with no description of the same points as those of semiconductor device 1G.

Amorphous semiconductor 44 is formed in the outer peripheral surface of semiconductor layer 40 (Si layer) to cover semiconductor layer 40 (Si layer).

Amorphous semiconductor 44 is made of Si included in the Si layer and melts, solidifies, and adheres to the side surface of the Si layer when the Si layer undergoes laser dicing in the step of singulation of semiconductor device 1H. Cracks in the Si layer and separation of part of the Si layer are therefore avoided when the Ag and Ni layers undergo the following blade dicing.

FIG. 19 is a cross-sectional view of semiconductor device 1J according to an embodiment. Semiconductor device 1J includes semiconductor layer 40 (Si layer), metal layers 30 (Ni layer) and 31 (Ag layer), transistors 10 and 20, and grooves 43A and 43B, as shown in FIG. 19. Semiconductor device 1J differs from semiconductor device 1G in that semiconductor device 1J includes grooves 43A and 43B. Semiconductor device 1J will be described below primarily on the different point with no description of the same points as those of semiconductor device 1G.

Transistor 10 includes a plurality of grooves 41 (plurality of first grooves, main body trenches), which are filled with a solid component included in gate conductor 15 and gate insulating film 16, in principal surface 40a of the Si layer.

Transistor 20 includes a plurality of grooves 42 (plurality of second grooves, main body trenches), which are filled with a solid component included in gate conductor 25 and gate insulating film 26, in principal surface 40a of the Si layer.

The plurality of grooves 43A and the plurality of grooves 43B are a plurality of third grooves (dummy trenches) formed in an outer edge portion of principal surface 40a of semiconductor layer 40 (Si layer) along the outer peripheral side of semiconductor layer 40 (Si layer) and filled with a solid component containing silicon. The plurality of grooves 43A are disposed in an outer edge portion facing transistor 10 out of the above-mentioned outer edge portion of principal surface 40a. The plurality of grooves 43B are disposed in an outer edge portion facing transistor 20 out of the above-mentioned outer edge portion of principal surface 40a.

The solid component with which the plurality of grooves 43A and the plurality of grooves 43B are filled may be made of the same material as the solid component with which the plurality of grooves 41 and the plurality of grooves 42 are filled. In this case, the plurality of grooves 43A and the plurality of grooves 43B can be formed in the same step as the step of forming the plurality of grooves 41 and the plurality of grooves 42. The manufacturing steps can thus be simplified.

Therefore, in the step of singulation of semiconductor device 1J, a situation in which cracks in the Si layer and partial separation of the Si layer that occur in the blade dicing reach body regions 18 and 28 can be avoided.

Gap LgA between the plurality of grooves 41 and the plurality of grooves 43A and gap LgB between the plurality of grooves 42 and the plurality of grooves 43B may be greater than gap Pg1 between adjacent ones of the plurality of grooves 41 and may be greater than gap Pg2 between adjacent ones of the plurality of grooves 42.

Therefore, since gaps LgA and LgB are greater than gaps Pg1 and Pg2 between the grooves in the main body, the occupancy factor of a mask pattern for manufacturing semiconductor device 1J can be reduced to fall within a stably manufacturable range.

Semiconductor device 1J further includes passivation layer 35 (protection layer) formed to overlap with part of source electrode 11 or 21. In the plan view of semiconductor layer 40 (Si layer), the outer periphery of passivation layer 35 may be formed inside the outer periphery of semiconductor layer 40 (Si layer) with a gap between the outer peripheries, and the plurality of grooves 43A and the plurality of grooves 43B may be formed in the segment between the outer periphery of semiconductor layer 40 (Si layer) and the outer periphery of passivation layer 35 in the plan view described above.

Resistance to cracks in the Si layer and partial separation of the Si layer that occur in the blade dicing can therefore be improved also in the outer edge portion of principal surface 40a of the Si layer, where no passivation layer 35 is formed so that resistance to cracks in the Si layer and partial separation of the Si layer is poor.

The interval between the plurality of grooves 43A and the plurality of grooves 43B may be equal to the interval between the plurality of grooves 41 and the plurality of grooves 42.

The plurality of grooves 43A and the plurality of grooves 43B can therefore be formed at the same time in the step of forming the plurality of grooves 41 and the plurality of grooves 42, whereby the design and manufacture of semiconductor device 1J can be simplified.

Other Embodiments

Although a semiconductor device according to one or more aspects of the present disclosure has been described based on an embodiment, the present disclosure is not limited to this embodiment. Those skilled in the art will readily appreciate that embodiments arrived at by making various modifications to the above embodiment or embodiments arrived at by selectively combining elements disclosed in the above embodiment without materially departing from the scope of the present disclosure may be included within one or more aspects of the present disclosure.

In the present embodiment, semiconductor device 1, in which two vertical MOS transistors are formed in a semiconductor substrate comprising silicon, has been presented by way of example. The semiconductor device according to the present invention includes a semiconductor device having the following configuration.

FIG. 20 is a schematic cross-sectional view of the portion corresponding to one vertical III-group-nitride semiconductor transistor included in semiconductor device 100 according to an embodiment. Semiconductor device 100 is a chip-size-package-type III-group-nitride semiconductor transistor that allows facedown mounting. The vertical III-group-nitride semiconductor transistor included in semiconductor device 100 includes substrate 132, which comprises an n-type III-group-nitride semiconductor, n-type III-group-nitride semiconductor layer 133 (and 143), p-type III-group-nitride semiconductor layer 134 (and 144), and metal layers 130 and 131, as shown in FIG. 20. Semiconductor device 100 is provided with a recess passing through part of III-group-nitride semiconductor layer 134 and having a bottom that reaches III-group-nitride semiconductor layer 133. Semiconductor device 100 is further provided with a recess passing through part of III-group-nitride semiconductor layer 144 and having a bottom that reaches III-group-nitride semiconductor layer 143. Further, III-group-nitride semiconductor layer 137 and III-group-nitride semiconductor layer 135, which has a bandgap wider than that of III-group-nitride semiconductor layer 137, are sequentially formed to cover the bottom and the side of each of the recesses and part of the surface of III-group-nitride semiconductor layer 134. III-group-nitride semiconductor layer 147 and III-group-nitride semiconductor layer 145, which has a bandgap wider than that of III-group-nitride semiconductor layer 147, are sequentially formed to cover the bottom and the side of each of the recesses and part of the surface of III-group-nitride semiconductor layer 144. Further, gate conductor 119 is formed on the surface of III-group-nitride semiconductor layer 134, and source electrode 111 is formed on the upper layer of III-group-nitride semiconductor layer 135. Further, gate conductor 129 is formed on the surface of III-group-nitride semiconductor layer 144, and source electrode 121 is formed on the upper layer of III-group-nitride semiconductor layer 145. Two-dimensional electron gas 136 is created in the vicinity of the boundary between III-group-nitride semiconductor layer 137 and III-group-nitride semiconductor layer 135. Two-dimensional electron gas 146 is created in the vicinity of the boundary between III-group-nitride semiconductor layer 147 and III-group-nitride semiconductor layer 145.

Semiconductor layer 140, which is the laminate of III-group-nitride semiconductor layer 134, III-group-nitride semiconductor layer 133, and substrate 132, includes a first principal surface and a second principal surface that face in opposite directions. Semiconductor layer 150, which is the laminate of III-group-nitride semiconductor layer 144, III-group-nitride semiconductor layer 143, and substrate 132, includes a first principal surface and a second principal surface that face in opposite directions.

Metal layer 131 is a first metal layer that includes a third principal surface and a fourth principal surface that face in opposite directions, is disposed with the third principal surface in contact with the second principal surface, is thicker than semiconductor layers 140 and 150, and comprises the first metal material.

Metal layer 130 is a second metal layer that includes a fifth principal surface and a sixth principal surface that face in opposite directions, is disposed with the fifth principal surface in contact with the fourth principal surface, is thicker than semiconductor layers 140 and 150, and comprises the second metal material having a Young's modulus greater than that of the first metal material.

A first vertical III-group-nitride semiconductor transistor formed of substrate 132, III-group-nitride semiconductor layers 133, 134, 135, and 137, metal layers 130 and 131, gate conductor 119, and source electrode 111 is formed in a first region of semiconductor layer 140, and a second vertical III-group-nitride semiconductor transistor formed of substrate 132, III-group-nitride semiconductor layers 143, 144, 145, and 147, metal layers 130 and 131, gate conductor 129, and source electrode 121 is formed in a second region adjacent to the first region in the direction along the first principal surface.

Metal layer 131 functions as a common drain electrode to the first and second vertical III-group-nitride semiconductor transistors.

III-group-nitride semiconductor layers 133 and 143 may be a continuous single layer. III-group-nitride semiconductor layers 135 and 145 may be a continuous single layer. III-group-nitride semiconductor layers 137 and 147 may be a continuous single layer. Two-dimensional electron gases 136 and 146 may be continuous with each other. Moreover, a group 3 element included in III-group-nitride semiconductor layers 133, 134, 135, 137, 143, 144, 145, and 147 may be Al, Ga, or In, or a combination of these.

According to the configuration described above, in which metal layer 131 having a thickness for ensuring low on-resistance is in contact with metal layer 130 having a Young's modulus greater than that of metal layer 131 and thicker than semiconductor layers 140 and 150, warpage of semiconductor device 100 that occurs due to the contact of semiconductor layers 140 and 150 with metal layer 131 can be suppressed. Chip-size-package-type semiconductor device 100 that allows both reduction in on-resistance and suppression of warpage can therefore be provided.

FIG. 21 is a schematic cross-sectional view of the portion corresponding to one vertical SiC transistor included in semiconductor device 200 according to an embodiment. Semiconductor device 200 is a chip-size-package-type SiC (silicon carbide) power transistor that allows facedown mounting. The SiC transistor included in semiconductor device 200 includes SiC substrate 232 containing a high-concentration n-type impurity, low-concentration n-type impurity layer 233, and metal layers 230 and 231, as shown in FIG. 21. Low-concentration n-type impurity layer 233 is provided with p-type impurity layers each having a high-concentration n-type impurity layer formed therein. Source electrode 211 (and 221) is provided on the surfaces of the high-concentration n-type impurity layers in the p-type impurity layers and the surfaces of the p-type impurity layers to be in contact therewith, and gate conductor 219 (and 229) is provided via insulating film 216 in a position where gate conductor 219 (and 229) faces the p-type impurity layers between high-concentration n-type impurity layers in the p-type impurity layers and low-concentration n-type impurity layer 233.

Semiconductor layer 240, which is the laminate of low-concentration n-type impurity layer 233 and SiC substrate 232, includes a first principal surface and a second principal surface that face in opposite directions.

Metal layer 231 is a first metal layer that includes a third principal surface and a fourth principal surface that face in opposite directions, is disposed with the third principal surface in contact with the second principal surface, is thicker than semiconductor layer 240, and comprises the first metal material.

Metal layer 230 is a second metal layer that includes a fifth principal surface and a sixth principal surface that face in opposite directions, is disposed with the fifth principal surface in contact with the fourth principal surface, is thicker than semiconductor layer 240, and comprises the second metal material having a Young's modulus greater than that of the first metal material.

A first vertical SiC transistor formed of SiC substrate 232, low-concentration n-type impurity layer 233, metal layers 230 and 231, gate conductor 219, and source electrode 211 is formed in a first region of semiconductor layer 240, and a second vertical SiC transistor formed of SiC substrate 232, low-concentration n-type impurity layer 233, metal layers 230 and 231, gate conductor 229, and source electrode 221 is formed in a second region adjacent to the first region in the direction along the first principal surface.

Metal layer 231 functions as a common drain electrode to the first and second vertical SiC transistors.

According to the configuration described above, in which metal layer 231 having a thickness for ensuring low on-resistance is in contact with metal layer 230 having a Young's modulus greater than that of metal layer 231 and thicker than semiconductor layer 240, warpage of semiconductor device 200 that occurs due to the contact of semiconductor layer 240 with metal layer 231 can be suppressed. Chip-size-package-type semiconductor device 200 that allows both reduction in on-resistance and suppression of warpage can therefore be provided.

INDUSTRIAL APPLICABILITY

The semiconductor devices according to the invention of the present application in the form of a CSP-type semiconductor device can each be widely used as a variety of semiconductor devices formed of bidirectional transistors.

REFERENCE MARKS IN THE DRAWINGS 1, 1A, 1B, 1C, 1D, 1E, 1F, 1G, 1H, 1J, 100, 200 semiconductor device
2 control IC
3 battery
4 load
10 transistor (first vertical MOS transistor)
11, 11a, 11A, 11b, 11B, 11c, 11d, 21, 21a, 21A, 21b, 21B, 21c, 21d, 111, 121,
211, 221 source electrode
12, 13, 22, 23 portion
14, 24 source region
15, 25, 119, 129, 219, 229 gate conductor
16, 26 gate insulating film
18, 28 body region
19, 19A, 19B, 29, 29A, 29B gate electrode
20 transistor (second vertical MOS transistor)
30, 31, 130, 131, 230, 231 metal layer
30a, 30b, 31a, 31b, 40a, 40b, 50a, 50b, 51a, 51b principal surface
32 semiconductor substrate
33 low-concentration impurity layer
34 interlayer insulating layer
35 passivation layer
36A, 36B, 37A, 37B, 38 protrusion
39 combined object
40, 140, 150, 240 semiconductor layer
41, 42, 43A, 43B, 60 groove
44 amorphous semiconductor
50, 51 cover layer
70A, 70C, 70E first layer
70B, 70D, 70F second layer
132 substrate
133, 134, 135, 137, 143, 144, 145, 147 III-group-nitride semiconductor layer
136, 146 two-dimensional electron gas
216 insulating film
232 SiC substrate
233 low-concentration n-type impurity layer

The invention claimed is:
1. A semiconductor device which is a chip-size-package-type semiconductor device that is facedown mountable, the semiconductor device comprising:
   a semiconductor layer that includes a first principal surface and a second principal surface that face in opposite directions, and comprises silicon, gallium nitride, or silicon carbide;
   a first metal layer that includes a third principal surface and a fourth principal surface that face in opposite directions, is disposed with the third principal surface in contact with the second principal surface, is thicker than the semiconductor layer, and comprises a first metal material;
   a second metal layer that includes a fifth principal surface and a sixth principal surface that face in opposite directions, is thicker than the semiconductor layer, and comprises a second metal material having a Young's modulus greater than a Young's modulus of the first metal material;
   a first vertical field effect transistor disposed in a first region of the semiconductor layer; and a second vertical field effect transistor disposed in a second region adjacent to the first region in a direction along the first principal surface in the semiconductor layer,
wherein the first vertical field effect transistor includes a first source electrode and a first gate electrode on a side facing the first principal surface of the semiconductor layer,
the second vertical field effect transistor includes a second source electrode and a second gate electrode on the side facing the first principal surface of the semiconductor layer,
the first metal layer functions as a common drain electrode for the first vertical field effect transistor and the second vertical field effect transistor, and
a bidirectional path from the first source electrode to the second source electrode via the common drain electrode is a primary current path.

2. The semiconductor device according to claim 1, wherein a horizontal cycle of irregularities of the sixth principal surface is greater than a crystal grain horizontal size of crystal grains included in the second metal layer.

3. The semiconductor device according to claim 1, wherein a crystal grain size in the fifth principal surface of the second metal layer is less than a crystal grain size in the fourth principal surface of the first metal layer.

4. The semiconductor device according to claim 1, wherein a coefficient of thermal expansion of the second metal material is less than a coefficient of thermal expansion of the first metal material.

5. The semiconductor device according to claim 1, wherein the second metal layer has a thickness of at most 30 μm.

6. The semiconductor device according to claim 1, wherein the second metal layer includes:
    a first layer including the fifth principal surface; and
    a second layer including the sixth principal surface, and
a crystal grain size in the second layer is greater than a crystal grain size in the first layer.

7. The semiconductor device according to claim 1, wherein the second metal layer includes:
    a first layer including the fifth principal surface; and
    a second layer including the sixth principal surface, and
a crystal grain size in the second layer is less than a crystal grain size in the first layer.

8. The semiconductor device according to claim 1, wherein the second metal layer includes:
    a first layer including the fifth principal surface; and
    a second layer including the sixth principal surface, and
a crystal grain size in the first layer is approximately equal to a crystal grain size in the second layer, and a crystal grain size in the second metal layer is less than a crystal grain size in the first metal layer.

9. The semiconductor device according to claim 1, wherein the second metal layer includes:
    a first layer including the fifth principal surface; and
    a second layer including the sixth principal surface, and
a metal crystal included in the first layer and a metal crystal included in the second layer differ from each other in terms of preferred orientation plane in a horizontal direction of the sixth principal surface.

10. The semiconductor device according to claim 9, wherein in the horizontal direction of the sixth principal surface,
a metal crystal included in one of the first layer and the second layer has {100} plane preferred orientation, and a metal crystal included in the other of the first layer and the second layer has {110} plane preferred orientation.

11. The semiconductor device according to claim 1, wherein a metal crystal included in the second metal layer has {100} preferred orientation in the sixth principal surface.

12. The semiconductor device according to claim 1, wherein a metal crystal included in the second metal layer has {110} preferred orientation in the sixth principal surface.

13. The semiconductor device according to claim 1, further comprising:
    a mark on the sixth principal surface of the second metal layer,
    wherein a pattern width of the mark is greater than a horizontal cycle of irregularities of the sixth principal surface.

14. The semiconductor device according to claim 13, wherein a pattern depth of the mark is greater than a mean roughness depth of the irregularities of the sixth principal surface.

15. The semiconductor device according to claim 1, further comprising:
    a first protrusion that is located in an outer periphery of the second metal layer in a plan view of the second metal layer and protrudes from the sixth principal surface in a direction from the fifth principal surface toward the sixth principal surface,
    wherein the first protrusion contains at least one of the first metal material and the second metal material.

16. The semiconductor device according to claim 15, wherein the first protrusion is located on each of two opposing outer peripheral sides of the second metal layer in the plan view.

17. The semiconductor device according to claim 15, wherein a protruding height of the first protrusion is at least ⅓ of a thickness of the second metal layer.

18. The semiconductor device according to claim 15, wherein a protruding width of the first protrusion is at least 4 μm.

19. The semiconductor device according to claim 15, wherein a content of the second metal material in the first protrusion is greater than a content of the first metal material in the first protrusion.

20. The semiconductor device according to claim 1, wherein an outer periphery of the semiconductor layer is located inside an outer periphery of the first metal layer with a gap between the outer peripheries in a plan view of the semiconductor layer,
    the semiconductor device further comprises a second protrusion that is located in the outer periphery of the first metal layer in a plan view of the first metal layer and protrudes from the third principal surface in a direction from the fourth principal surface toward the third principal surface, and
    the second protrusion contains at least one of the first metal material and the second metal material.

21. The semiconductor device according to claim 20, wherein the second protrusion is located on each of two opposing outer peripheral sides of the first metal layer in the plan view.

22. The semiconductor device according to claim 1, further comprising:
    a third protrusion that is located in an outer peripheral surface of at least one of the first metal layer and the second metal layer and protrudes from a center of the first metal layer toward an outer periphery of the first metal layer in a plan view of the first metal layer.

23. The semiconductor device according to claim 1, further comprising:
a first cover layer that includes a seventh principal surface and an eighth principal surface that face in opposite directions, is disposed with the seventh principal surface in contact with the sixth principal surface, and comprises a ceramic or plastic material.

24. The semiconductor device according to claim 1, further comprising:
a second cover layer that is located at an outer edge portion of the first metal layer in a plan view of the first metal layer, includes a ninth principal surface and a tenth principal surface that face in opposite directions, is disposed with the tenth principal surface in contact with the third principal surface, and comprises a ceramic or plastic material.

25. The semiconductor device according to claim 24, comprising:
a groove located along an outer peripheral side of the semiconductor layer and including a bottom surface that is the third principal surface, the outer peripheral side being an outer edge portion of the semiconductor layer.

26. The semiconductor device according to claim 1, further comprising:
a combined object that is a combination of the first metal material and the second metal material and is located in an outer peripheral surface of at least one of the first metal layer and the second metal layer.

27. The semiconductor device according to claim 26, wherein the combined object is located in the outer peripheral surface over an entire periphery of the semiconductor device in a plan view of the first metal layer and the second metal layer.

28. The semiconductor device according to claim 26, wherein in a direction from the third principal surface toward the sixth principal surface, a position of a center of the combined object is between a position corresponding to half a distance from the third principal surface to the sixth principal surface and a position of the sixth principal surface.

29. The semiconductor device according to claim 1, wherein an outer periphery of the semiconductor layer is located inside an outer periphery of the first metal layer with a gap between the outer peripheries in a plan view of the semiconductor layer.

30. The semiconductor device according to claim 29, wherein the outer periphery of the semiconductor layer is located inside the outer periphery of the first metal layer over an entire periphery of the semiconductor device with the gap between the outer peripheries in the plan view.

31. The semiconductor device according to claim 29, wherein the gap has a length of at least 15 µm.

32. The semiconductor device according to claim 29, wherein a mean roughness depth of irregularities of a first portion of an outer peripheral surface of the semiconductor layer is approximately equal to a mean roughness depth of irregularities of a second portion of the outer peripheral surface, the first portion being in contact with the third principal surface and on a side facing the second principal surface, the second portion being on a side facing the first principal surface.

33. The semiconductor device according to claim 29, wherein an outer peripheral surface of the semiconductor layer has an irregular shape containing acute vertices.

34. The semiconductor device according to claim 29, wherein an outer peripheral surface of the semiconductor layer is covered with an amorphous semiconductor.

35. The semiconductor device according to claim 1, wherein the semiconductor layer includes a semiconductor substrate on a side facing the second principal surface and comprises silicon, and
a low-concentration impurity layer that is located on a side facing the first principal surface and contains an impurity of a first conductivity type in a lower concentration than a concentration of an impurity of the first conductivity type in the semiconductor substrate,
the first vertical field effect transistor includes a plurality of first grooves located in a surface of the semiconductor layer and filled with a solid component containing a first gate conductor,
the second vertical field effect transistor includes a plurality of second grooves located at the surface of the semiconductor layer and filled with a solid component containing a second gate conductor, and
the semiconductor device further comprises:
a plurality of third grooves located along an outer peripheral side of the semiconductor layer and filled with a solid component containing silicon, the outer peripheral side being an out edge surface of the semiconductor layer.

36. The semiconductor device according to claim 35, wherein (i) a gap between the plurality of first grooves and the plurality of third grooves and (ii) a gap between the plurality of second grooves and the plurality of third grooves are greater than a gap between adjacent grooves of the plurality of first grooves and are greater than a gap between adjacent grooves of the plurality of second grooves.

37. The semiconductor device according to claim 35, further comprising:
a protection layer that overlaps with part of the first or second source electrode,
wherein an outer periphery of the protection layer is located inside an outer periphery of the semiconductor layer with a gap between the outer peripheries in a plan view of the semiconductor layer, and
the plurality of third grooves are located across a portion from the outer periphery of the semiconductor layer to the outer periphery of the protection layer in the plan view.

38. The semiconductor device according to claim 35, wherein an interval between the plurality of third grooves is equal to an interval between the plurality of first grooves and an interval between the plurality of second grooves.

* * * * *